US010444038B2

(12) United States Patent
Tyrer

(10) Patent No.: US 10,444,038 B2
(45) Date of Patent: Oct. 15, 2019

(54) DETECTING PERSONNEL, THEIR ACTIVITY, FALLS, LOCATION, AND WALKING CHARACTERISTICS

(71) Applicant: Harry W. Tyrer, Columbia, MO (US)

(72) Inventor: Harry W. Tyrer, Columbia, MO (US)

( * ) Notice: Subject to any disclaimer, the term of this patent is extended or adjusted under 35 U.S.C. 154(b) by 239 days.

(21) Appl. No.: 15/793,665

(22) Filed: Oct. 25, 2017

(65) Prior Publication Data

US 2018/0113006 A1    Apr. 26, 2018

Related U.S. Application Data

(60) Provisional application No. 62/412,570, filed on Oct. 25, 2016.

(51) Int. Cl.
| | |
|---|---|
| *G01D 5/24* | (2006.01) |
| *G08B 21/04* | (2006.01) |
| *G01D 21/00* | (2006.01) |
| *G01R 27/02* | (2006.01) |

(52) U.S. Cl.
CPC .............. *G01D 5/24* (2013.01); *G01D 21/00* (2013.01); *G08B 21/043* (2013.01); *G08B 21/0492* (2013.01); *G01R 27/02* (2013.01); *G08B 21/0438* (2013.01); *G08B 21/0461* (2013.01)

(58) Field of Classification Search
CPC .. G01D 5/00; G01D 5/12; G01D 5/14; G01D 5/24; G01D 21/00; G01R 27/00; G01R 27/02; G08B 21/00; G08B 21/02; G08B 21/04; G08B 21/0407; G08B 21/043; G08B 21/0438; G08B 21/0461; G08B 21/0469; G08B 21/0492

USPC ....... 324/600, 602, 605, 607, 649, 658, 686; 702/108, 124, 126, 127, 182, 183, 185, 702/188, 189, 198
See application file for complete search history.

(56) References Cited

U.S. PATENT DOCUMENTS

| | | | |
|---|---|---|---|
| 7,982,605 B2* | 7/2011 | Freebody | G08B 3/10 340/12.15 |
| 8,952,818 B1* | 2/2015 | Zhang | G08B 21/0446 340/573.1 |
| 9,619,987 B2* | 4/2017 | Desgorces | G08B 21/043 |
| 9,866,797 B2* | 1/2018 | Clark | H04N 7/181 |
| 10,037,673 B1* | 7/2018 | Gray | G08B 5/36 |

(Continued)

OTHER PUBLICATIONS

Rohan Vasantha Neelgund; Floor Sensor Development Using Signal Scavenging for Personnel Detection System; Jun. 2010.

(Continued)

*Primary Examiner* — Hoai-An D. Nguyen
(74) *Attorney, Agent, or Firm* — Stanley J. Gradisar Attorney At Law, LLC; Stanley J. Gradisar

(57) ABSTRACT

A device that detects people walking or moving on a floor. It consists of a floor sensor system, usually under a carpet, an electronic interface, computing and storage, a real-time display, data recall, web access and notification. Sophisticated computational intelligence algorithms are used to detect people who fall on the floor. Also detectable is any ambulatory activity, fall or drop and if classified as an event, the event can be sent as a notification via a cell phone, SMS messaging, email, or pagers to the appropriate recipient. Once installed the system operates continuously and the data can be stored for years in the cloud or other format, and can be used to show diagnostically important functional changes.

20 Claims, 8 Drawing Sheets

(56) References Cited

U.S. PATENT DOCUMENTS

| | | | | |
|---|---|---|---|---|
| 2010/0286490 | A1* | 11/2010 | Koverzin | A61B 5/16 |
| | | | | 600/301 |
| 2015/0269824 | A1* | 9/2015 | Zhang | G08B 21/0438 |
| | | | | 340/539.12 |
| 2016/0217664 | A1* | 7/2016 | Bradford | E04F 15/02 |
| 2018/0003847 | A1* | 1/2018 | Casimiro | A61B 5/1117 |

OTHER PUBLICATIONS

Mohammed, Ashrafuddin; Design of a Signal Scavenging Sensor System for Passive Monitoring in Elder Care Technology; Jul. 2010.

Uday Govindrao Shriniwar; Data Control for Signal Scavenging for a Personnel Detection System; Jul. 2010.

Krishna Kishor Devarakonda; Data Display for a Signal Scavenging Personnel Detection System; May 2011.

Kaustubh Raghunath Gadre; Fall Detection System Using Low Cost Computing and Online Communication; Jul. 2012.

Naren Kumar Vudalinarasimha; Data Processing System for a Personnel Walking Activity Detector; Aug. 2014.

Chinchao Suriyakul; A New Circuit for Personnel Detection Using Signal Scavenging; May 2015.

Myra A. Aud et al., Smart Carpet, Developing a Sensor System to Detect Falls and Summon Assistance; Jun. 2010.

Harry W. Tyrer, PhD et al.; Evolution of an Eldercare Technology System to Monitor Motion and Detect Falls; Jun. 2011.

Harry W. Tyrer, PhD et al.; Faux-Floor Development System for Personnel Detection Using Signal Scavenging Sensors; Sep. 2010.

Harry W. Tyrer, PhD et al.; Signal Scavenging for Passive Monitoring in Eldercare Technology; Apr. 2009.

* cited by examiner

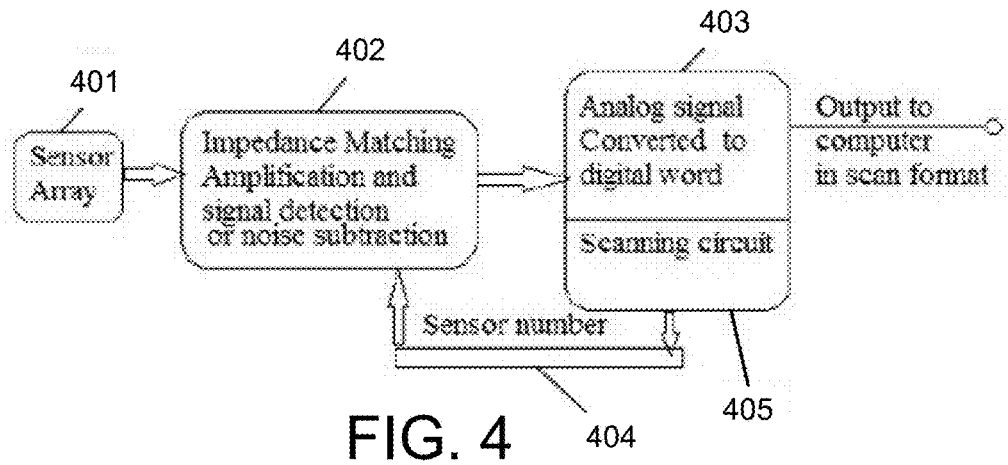
FIG. 4
501
5A01234567889ABCDEF01234567E
502
FIG. 5
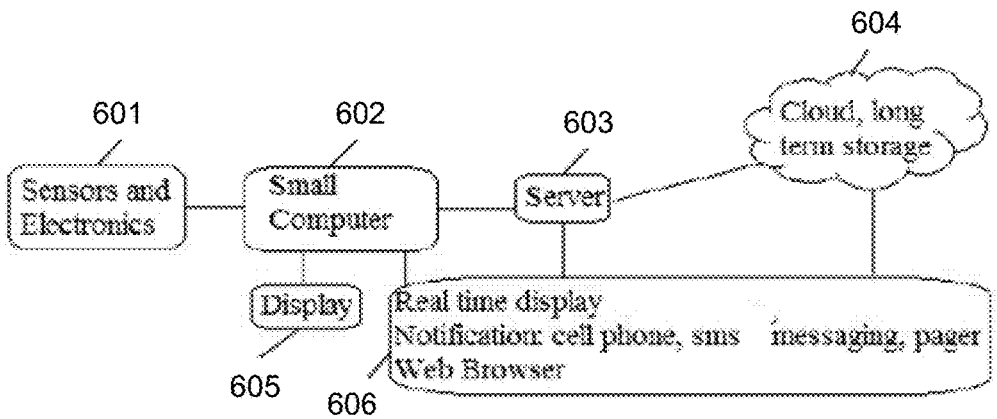
FIG. 6

DETECTING PERSONNEL, THEIR ACTIVITY, FALLS, LOCATION, AND WALKING CHARACTERISTICS

CROSS-REFERENCES TO RELATED APPLICATIONS

This application claims the benefit of U.S. Provisional Application Ser. No. 62/412,570 filed on Oct. 25, 2016 titled "Detecting Personnel, Their Activity, Falls, Location, And Walking Characteristics" which is incorporated herein by reference in its entirety for all that is taught and disclosed therein.

BACKGROUND

The population of elderly people, also referred to as seniors, is perhaps the fastest growing segment of the population in advanced societies. Their loss of physical and cognitive function requires help and support provided by governments, institutions and family. In turn, seniors want to live fulfilling, independent lives that they can afford. There is a time between full functionality and loss that requires dependent care that a senior can live independently and safely and within their means, without constant supervision, if adequate unobtrusive monitoring is available. The present device provides and reports such monitoring; it lays on the floor and detects a person or a person's motion, which may include a walk, a fall, their gait parameters, and traversal to locations out of sensor range. The device extends the caregiver universe for the senior, offers lower costs compared to the alternatives, can maintain the individual's data indefinitely to provide timely functional assessment, and provides a means to notify their caregivers when circumstances require.

Here are a few cases of the use of the device to infer a dangerous situation. By recognizing the entrance and exit of a given person into a specific room, the safety of the situation is inferred. For example, the system infers that a person enters a kitchen, even though there are no floor sensors in the kitchen, and turns on the stove. A stove sensor indicates the heated stove, and the carpet segment detects that the person has left the kitchen, clearly creating a possible hazard. In another case, the system infers that a person has entered the bathroom. The system keeps track of the characteristic of the bathroom visits such as time, and length of stay. An extended stay over the typical time length of stay in the bathroom can indicate a dangerous fall. The system can gently inform the circle of caregivers of that event, and previous discussions with the affected resident can lead to help. There are other similar scenarios that constitute a significant hazard to the resident, property and to life.

In application, the sensor array can identify motion caused by people and requires many resources to make its decisions. Whereas a single pad identifies a break-in through a window or other points of ingress in security applications. Furthermore, hospitals can benefit from detecting people leaving the bed or room. Therefore, a small pad that detects motion will be useful. Strategically placed pads can determine direction of motion using Cloud based interconnections.

SUMMARY

This Summary is provided to introduce in a simplified form a selection of concepts that are further described below in the Detailed Description. This Summary is not intended to identify key or essential features of the claimed subject matter, nor is it intended to be used to limit the scope of the claimed subject matter.

As used herein, "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B, and C together. When each one of A, B, and C in the above expressions refers to an element, such as X, Y, and Z, or class of elements, such as X1-Xm, Y1-Yn, and Z1-Zo, the phrase is intended to refer to a single element selected from X, Y, and Z, a combination of elements selected from the same class (e.g., X1 and X2) as well as a combination of elements selected from two or more classes (e.g., Y1 and Z3).

It is to be noted that the term "a entity" or "an entity" refers to one or more of that entity. As such, the terms "a" (or "an"), "one or more," and "at least one" can be used interchangeably herein. It is also to be noted that the terms "comprising," "including," and "having" can be used interchangeably.

The term "means" as used herein shall be given its broadest possible interpretation in accordance with 35 U.S.C., Section 112, Paragraph 6. Accordingly, a claim incorporating the term "means" shall cover all structures, materials, or acts set forth herein, and all of the equivalents thereof. Further, the structures, materials or acts and the equivalents thereof, shall include all those described in the summary of the invention, brief description of the drawings, detailed description, abstract, and claims themselves.

Unless the meaning is clearly to the contrary, all ranges set forth herein are deemed to be inclusive of the endpoints.

All objects have some electrons that flow freely. In particular, the conducting property of copper or aluminum foil arises from the ease with which free electrons move. One can measure impedance to assess the ease of free electron motion. Electrons can be released to equilibrate between two touching surfaces. For example, touching a conducting foil with fingers (or hands or feet), equilibration of the free electrons occurs so that there are more or less electrons in the system depending on the touched conductor having more or less electrons. Electronic redistribution can be induced by waving body parts or clothing around the conductor. The decrease (or increase) in electrons can be detected as a voltage since voltage is proportional to charge by a constant called capacitance.

In stepping on a sensor, one sees an increase in voltage that reaches a peak and dies down as the excess buildup of electrons occurs, then drains off due to the conductivity of the substrate supporting the coil. Next one sees a negative peak as one steps off the sensor, as the sensor equilibrates to where it was, drawing its electrons from the substrate. One can electronically detect the corresponding signal, its positive value only, the square of the signal, its negative value and the integrals of each of the signal types named.

The device is a set of sensors placed onto a matrix, usually a plastic sheet, and lays on the floor. The full device consists of sensors, scanning, encoding and computational sections.

Sensors produce a signal when touched or activated, and an orderly array of sensors provides a two-dimensional image of the activated sensors. An arrangement of n×m sensors is called a segment. A segment will require scanning time proportional to m×n in reading each sensor, whereas with a sufficiently rapid scan and reading each row and column simultaneously the time is proportional to m+n.

Using electronics, one can detect the charge redistribution caused by motion sensed in conducting materials. Since the charge redistribution results in a net charge, electronics can detect the corresponding voltage. Impedance matching may be necessary to accommodate the low power of the charge redistribution. Amplification of the signal provides linear or nonlinear gain, adjusting the DC offset of the signal reduces the noise, and converting the signal to digital by various means, provides for use in a computer and communication.

The electronic circuitry for scanning, electronic detection and signal conditioning can be imagined as single circuit, which has two inputs and one output. The sensors provide an input to the circuit so that the encoding circuit provides signals, which identify the activated sensors. The system linearly or non-linearly amplifies the signal; dc shifts it to minimize noise, and converts it to a digital bit or byte. A bit identifies only activation or non-activation to effect further noise reduction; a byte indicates signal level on a sensor. The second input to the circuit comes from the data-encoding unit and is the address, which identifies the sensor providing the signal and provides it with a channel to the electronics. The output is from a single sensor and it is either a single bit, or a byte, which is a sequence of ones and zeroes.

Data encoding provides an output that associates the sensor's location with its value. It has one input and two outputs. The input is the conditioned signal from the sensor and may be a single bit or a byte. The first output is a bit string that represents a complete scan through all the sensors, that is a complete scan of the segment. A scan comes from a set of m×n sensors that makes up a segment; a scan is a computationally usable unit of data for use in further operations. A second output provides the address of each sensor to the scanning circuit.

A scan of a set of sensors is organized to store data in a useful format, form mathematically useful entities, and create computer useful files. These entities are useful in performing calculations. These calculations communicated to others using the Internet, wireless transmission, or other forms of transmission will be very beneficial. Specifically, the sensors and electronics are used to obtain scans, calculate that a fall has occurred, and communicate via cell-phone that a fall has likely occurred and help needs to be provided to the putative fallen resident. Similarly, since the scans continuously take data, which can be stored for later calculations, a continuous record of a resident's walk characteristics exists. The walk characteristics change with age of the resident and will have diagnostic value.

Computation and communication provides the means to run all the application to the personnel sensing system. Computational and communication resources provide the specialization or personality to the device to perform specific tasks. The most basic applications are display, notification, Internet access, cloud access, and computational intelligence. The data encoding circuit provides a set of scans that constitute an activity. These scans can be stored in the cloud, on a web server or any appropriate storage mechanism. Appropriate application programs can perform computationally manipulation, do fall detection, gait characterization, and infer resident behavior from knowing their location.

BRIEF DESCRIPTION OF THE SEVERAL VIEWS OF THE DRAWINGS

FIG. 4 shows a block diagram of an electronic interface to a computer in one embodiment.

FIG. 5 shows a model scan from a three-segment sensor array in one embodiment.

FIG. 6 shows a block diagram of the computing interactions in one embodiment.

DETAILED DESCRIPTION

The invention may be implemented as a computer, a computing system or as an article of manufacture such as a computer program. The computer program product may be a computer storage medium readable by a computer system and encoding a computer program of instructions for executing a computer process.

While the invention is disclosed as a system, it will be understood by a person of ordinary skill in the art that conventional data processors, including a CPU, memory, I/O, program storage, a connecting bus, and other appropriate components, could be programmed or otherwise designed to facilitate the practice of the method of the invention.

The invention may also be practiced as a method, or more specifically as a method of operating a computer system. Such a system would include appropriate program means for executing the method of the invention.

Also, an article of manufacture, such as a pre-recorded disk or other similar computer program product, for use with a data processing system, could include a storage medium and program means recorded thereon for directing the data processing system to facilitate the practice of the method of the invention. It will be understood that such apparatus and articles of manufacture also fall within the spirit and scope of the invention.

With the computing environment in mind, embodiments of the present invention are described with reference to logical operations being performed to implement processes embodying various embodiments of the present invention. These logical operations are implemented (1) as a sequence of computer implemented steps or program modules running on a computing system and/or (2) as interconnected machine logic circuits or circuit modules within the computing system. The implementation is a matter of choice dependent on the performance requirements of the computing system implementing the invention. Accordingly, the logical operations making up the embodiments of the present invention described herein are referred to variously as operations, structural devices, acts, applications, or modules. It will be recognized by one skilled in the art that these operations, structural devices, acts, applications, and modules may be implemented in software, firmware, special purpose digital logic, and any combination thereof without deviating from the spirit and scope of the present invention as recited within the claims attached hereto.

Figure 1:
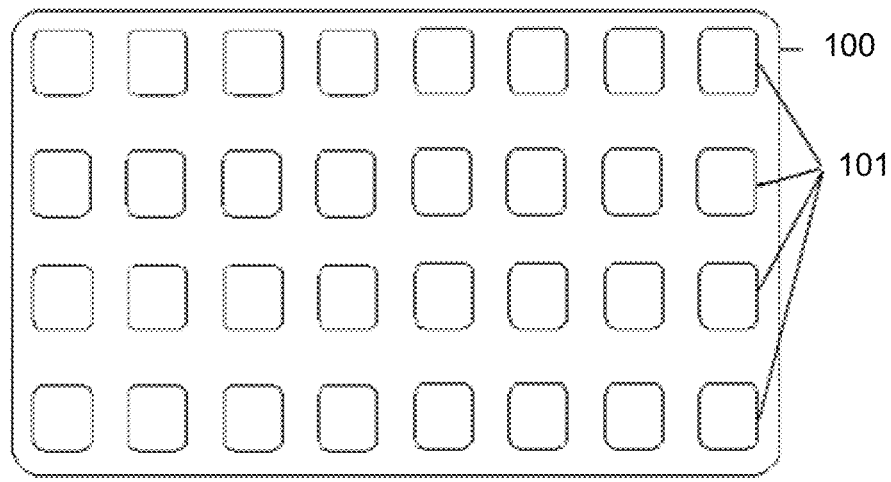
FIG. 1 shows a plan view of a segment consisting of thirty-two sensors in one embodiment.
Figure 8:
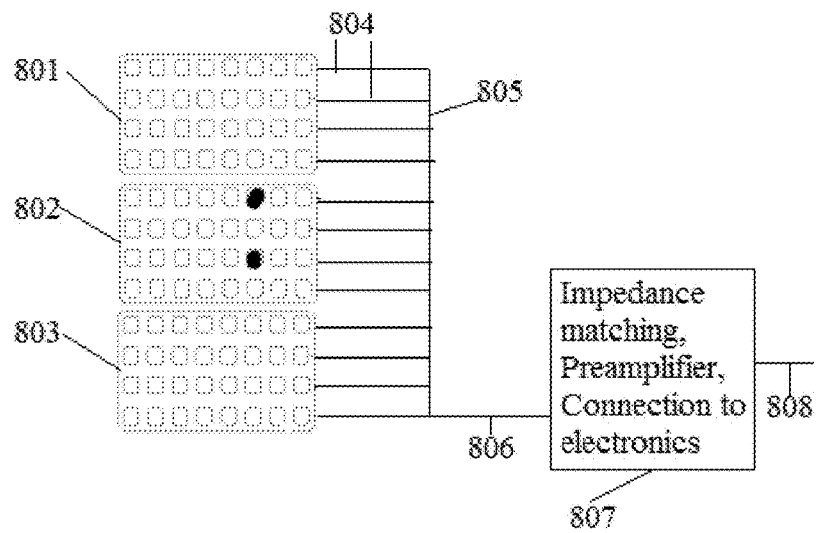
FIG. 8 shows a block diagram of a three-segment system and its connections to the electronics in an embodiment.

Sensors—Referring now to the Figures, like reference numerals and names refer to structurally and/or functionally similar elements thereof, and if objects depicted in the figures that are covered by another object, as well as the tag line for the element number thereto, may be shown in dashed lines. FIG. 1 a plan view of a segment consisting of thirty-two sensors in one embodiment. Referring now to FIG. 1, a segment 100 is an array of sensors 101 of a convenient length and width. In one embodiment, a standardized 32-sensor segment 100 is utilized so that each segment is scanned one after the other to present a complete display of the sensor activity on a floor. Any number of sensors 101 can be used although it is useful to use a power of 2. FIG. 1 shows the array of 32 sensors 101 which make up a segment 100. Each sensor connects to the input electronics. FIG. 8 shows how three arrays will be connected. The 96 sensors all connect to an input port in the electronics.

A sensor is a rectangular piece of conducting foil, such as a copper or aluminum sheet, of convenient size, and in one embodiment, is six inches by six inches. The system detects a change in the sensor current produced by touching the sensor with a foot. Touching the sensor causes an equilibration of the current in the sensor and the item touching it. This increases the current in the sensor producing a voltage proportional to the current. The touching produces activation and read by the electronics. Upon initial activation, the activating entity sheds its current to the sensor (even over dielectric medium). Since voltage is proportional to charge an increase in current reads as an increase in voltage that, depending on the medium, the voltage may immediately or later relax. Removing the activating entity reduces the total current, which produces a negative going voltage that again relaxes depending on the substrate material of the sensor.

One can reduce the sensor size for higher resolution, but increased signal degradation. Six-inch-by-six-inch sensors 101 spaced every foot on center produces a distance typically smaller than an adult step. In another embodiment, four and one-half inch by four and one-half inch sensors 101 can be spaced nine inches apart on center.

Figure 2:
FIG. 2 shows a side cross-section view of a segment in one embodiment.

A segment 100 is an array of sensors 101 whose electronic charge changes as people step on them. The layout of the sensors 101 appears in FIG. 1 and FIG. 2 shows a side cross-section view of a segment in one embodiment. Referring now to FIG. 2, the conductive sensor layer 202 and conducting ground layer 204 attach to a suitable middle substrate layer 203, such as vinyl, although many types of flexible non-conducting sheets can be used. The top layer 201 covers and protects the conductive sensor layer 202. Similarly, the bottom layer 205 protects the conducting ground layer 204. The segment 100 can then be covered by any suitable flooring material including carpet, vinyl-flooring material, linoleum, etc. Similarly, one can place the bottom layer directly on the floor without bottom layer 205.

Each layer 201, 203, 205 may be made of vinyl or any other suitable non-conducting, flexible or plastic medium. The sensors 101 can be a sheet of convenient size such as six inches by six inches made of aluminum or copper in one embodiment.

The penultimate bottom layer 204 is made of aluminum, copper strips or wire. Different grounding geometries impact the noise level picked up by the sensor 101. A ground layer 204 can be arranged in three different grounding configurations: (1) covering the whole sensor 101 area with a sheet of conducting material; (2) a grounding tape the width of a sensor 101, under all sensors 101 covering all row sensors 101 and all column sensors 101, and (3) tape the width of a sensor 101 covering only rows or columns.

For manufacturing, the sensors 101 can be fixed in either six or twelve-foot wide rolls of any length, similar to the manufacturing of carpets. All sensors 101 in a row connect to a terminator plug, which conducts signal to the electronics. The wiring is designed to allow cutting to any length and width. For example, a room may be eleven feet by ten feet. In that case, cut a twelve-foot roll the sensor pad correctly to fit the ten-foot length and cut out the first column of sensors 101 to make it eleven feet wide. The remaining sensors 101 can be set up to be a single segment covering the room as required.

Figure 3:
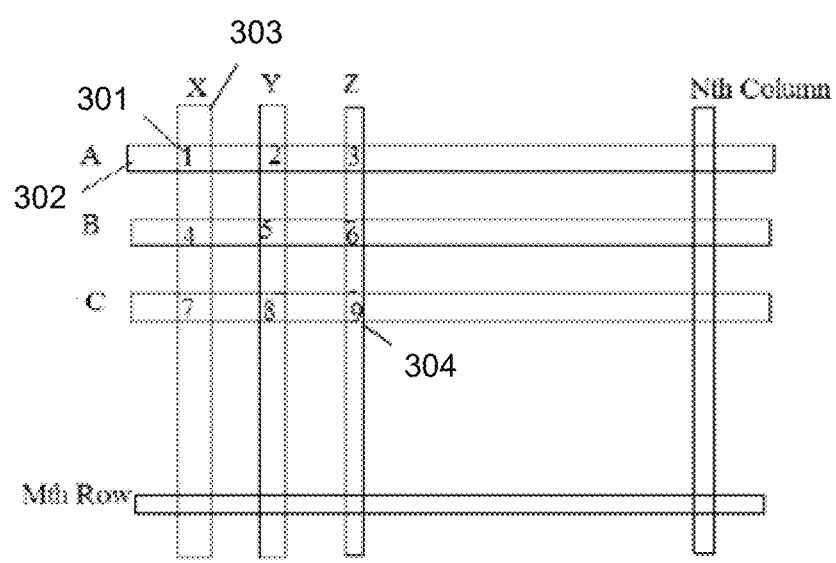
FIG. 3 shows a plan view of intersecting conductor ribbons in one embodiment.

FIG. 3 shows a plan view of intersecting conductor ribbons in one embodiment. Referring now to FIG. 3, a second array layout is possible using ribbons of conductors instead of metal foils affixed to the appropriate substrate layer. In FIG. 3 one can see that the activation of the intersection 1 301 of row A 302 and column X 303 causes that entire row A 302 and column X 303 to be activated. The system must guarantee activation of only row A 302 and column X 303, thus determining that the intersection of those two ribbons was activated. A fast scan is required or the specter of ghost activation occurs. Ghost activation can be seen by considering the activation of both intersection 1 301 and intersection 9 304. A single scan of the rows and columns indicates that rows A and C and columns X and Z have been activated, indicating that intersections 1 301 and 9 304 have been activated, but also intersections 3 and 7 are activated. One solution is fast scanning. The advantage is that the scan time is m+n, where as in the system described previously scanning time goes as the product of m×n, a substantial increase in segment scan time.

This design is a low-cost floor sensor array to detect personnel activity. Sensors 101 installed under a carpet detect a person's activities such as walking, standing, or having fallen. Electronic boards read the data from the sensors 101. Then a computer processes the data from the sensors 101 and sends notifications for specific events. The sensors 101 can be installed in any room and covered by a carpet, or any suitable flooring material.

Electronics—Electronic circuitry is required to provide impedance matching so that the change in sensor current can be detected. The circuitry then scans the sensors 101, to read the change in current, producing a voltage waveform.

FIG. 4 shows a block diagram of an electronic interface to a computer in one embodiment. Referring now to FIG. 4, the energy in the signal is modified from the sensors 101 in block 401, in various ways, including peak detection, rectifying only the positive signals, or the negative signals, or both, to double the energy detected in block 402. The circuit in block 402 also provides impedance matching to improve the ability to detect the signal. Since 60 Hz electrical noise is detected and the activating signal is many times the amplitude of the noise, after amplifying the activating signal the noisy baseline is threshold out for improved signal performance. Additional techniques include the use of non-linear amplifiers. And a differential amplifier can also be used to zero out the noise with a proper reference in block 402. Care must be taken with the reference phase to assure optimal subtraction results.

Retaining the identity or the number or the address of the activated sensor begins the step of associating the sensor signal with the correct sensor in block 404. A scanning circuit uses an address that is associated with a sensor's signal in block 403. Scanning may be done with analog multiplexers, or by turning amplifiers on and off. The address, associated with the sensor signal then goes to the encoding circuit. The choice of multiplexer or turning on the desired amplifier greatly affects the number of chips required to implement the electronics. When the signal conditioning circuit 402 hands the analog signal to the digital converting circuit 404, that signal represents the output of a single sensor at the address specified by the sensor number coming from the scanning circuit 405. The output from blocks 403 and 405 is sent to a computer in scan format (see FIG. 6).

Encoding—With a single bit indicating that the sensor is on or off, and its corresponding address known, the signal can be encoded into an array of bits indicating which sensors 101 are on. That is as the circuit reads each sensor 101, the single unit of data progresses through blocks 401, 402 and 403; the sensor has been chosen by the scanning circuit generating the sensor address and conveyed to the sensor 101 via 404. It also produces an output consisting of the signal and the address to the small computer 602, which will create the scan. Each scan is an encoding of the bits detected in a form to give the location of the activated sensor, or to associate a sensor with its exited voltage value. The scanning is essentially a hexadecimal encoding of the bit patterns of every four sensors. For example, consider a unit of four sensors 101, where there are sixteen possibilities of on/off combinations, for example five(hex) is 0101, that is sensors two and four are activated, the first sensor is off the next is on, then off, on. This data can be converted to an ASCII value suitable for reading as text.

FIG. 5 shows a model scan of a space containing an array of three segments 801 A, 802 B, and 803 C. Referring now to FIG. 5, the three arrays or segments which were scanned are shown in FIG. 8, note that segment 802 shows two darkened sensors in row three, indicating activation. A complete generic scan is shown in FIG. 5 and is bounded by the underlined characters (S, E) 501 indicate the start and end of a single scan over the sensors 101 for segments; Boldface (A, B, C) 502 indicates the segment. The hexadecimal numbers between the segment letters indicate which row and which sensors 101 are activated. Continuing the specific realistic example and recall that $A16=1010_2$. An example scan is SA0000000B00A00000C00000000E, note that in Segment B 802, the third-row number is A, indicating that sensors one and three are activated. Such a scan of the three segments is in suitable form for computer data. A microprocessor can be used to produce the address and produce the scan. The scan can be treated as a matrix, an important computational unit. This data is entered onto a computer for further processing.

Power—Using appropriate and available semiconductor devices, the system can be constructed with a single chip that encompasses all the electronic functionality. This device can be placed on a board inside an electrical box and can be powered directly from the house power. Power can be achieved with AC to DC adapters and DC to DC conversions performed for suitable voltages.

In constructing an electronic board two distinct steps are required. The first is the design of the board and the second is the actual building of the board. Modern design and construction is radically different from practice even a few years ago. All the electronics shown in FIG. 4, including 402, 403, 404, and 405, in FIG. 6 including 601 and parts of 602 and the complete system in FIG. 7, including 702, 703, 704, and 707, are placed into a single board for each segment in one embodiment.

Using standard electronics, the connections and integrated circuits, both analog and digital required for a 32-sensor segment is approximately ten by twelve inches. A very large size inconvenient for modern home installation. Worse, since each segment requires a separate board, a room may require there or four of these boards. By the use of System on a Chip (SoC), which features both analog and digital circuitry, one can reduce the chip count of one board to one chip plus a few support chips.

The manufacturer of SoC provide the necessary support software which can be used to design the electronic circuitry. Using the provided Electronic Computer Aided Design app each sensor can be connected to the amplifiers, in turn connected to the analog to digital controller and finally connected to the on-chip microprocessor. The microprocessor can be programmed to produce a scan which can be stored or further processed.

The size of the chip is such that it can be placed in to a standard electrical switch box. Placing a bus and power supply in the switch box still allows sufficient space to place several circuit boards in the box, representing several segments. So, a single room can usually be supported by one switch box. Importantly, the house wiring can be connected directly to the power supply.

Computing Resources—FIG. 6 shows a block diagram of the computing interactions in one embodiment. Referring now to FIG. 6, the data entered into a computer server 603 is in the form of a scan of the segments of sensors 101 that are in a room. A useful way to implement the circuit in blocks 403, 404 and 405 is with a microprocessor or a small computer 602. The difference between the computing resources is in the power required by the computer. Using a large microprocessor or a small computer for 602, can provide many of the important functions such as providing notifications display of data and as a server to a web browser. Similarly, a computer server 603 can take the output of 602 as a scan and provide more sophisticated computation and communication. Whether one uses 602 or 603, access to the web is possible; long term storage, storage in the cloud, a variety of displays web based or not, and the performance of a variety of algorithms in real time to provide useful and important data. A floor's scan is stored and used in one of three forms: (1) as raw data—each scan is followed one after the other; (2) in matrix form—the data is stored in an array determined by the layout of the room; and (3), by activated sensor number (usually row and column location rather than a number), making use of the sparse nature of the matrix data. This data can be visualized immediately, or further processed including data storage in either a storage device or in the cloud.

A small low-cost computer 602 can act as a server and provides client server support to connect to the internet and the cloud. In turn, connections can be made to the web, to cell phones and to pagers. The on-board operating system controls system resources, and micro SD cards provide storage functionality, and a small thin film display device provides command line language visualization using a status-reporting program. Data storage, in addition to the raw data, matrix data, and positional data formats, includes database format. The use of both the client-server model of computing and the browser-server model, serves to support users with processing capability and Web access.

FIG. 6 shows the computing possibilities, which can be provided as needed. The small computer 602 is a low-cost computer that has its own display 605, but can provide all the functionality including that of a web server. A second computer server 603 can increase computing power and provide all the functionality but with greater options. Finally, the cloud 604 provides primarily long-term storage. The elderly will benefit from this in that loss of walking functionality can be determined with this data.

The data can be processed to identify falls, an important issue for the elderly and report them by cell-phone or pager to caregivers. Falls are a significant event as are lack of motion. Since the system scans the sensor array every tenth of a second or faster, it is possible to detect and identify activated sensors 101, and identify and report a significant event via 606 (SMS, web services, email, and/or any other appropriate device). Also, one can store the data on the cloud 604 or local device for display, long term processing, and for archival purposes. This makes the sensor floor system a device important in expanding the quality of life of seniors.

Figure 7:
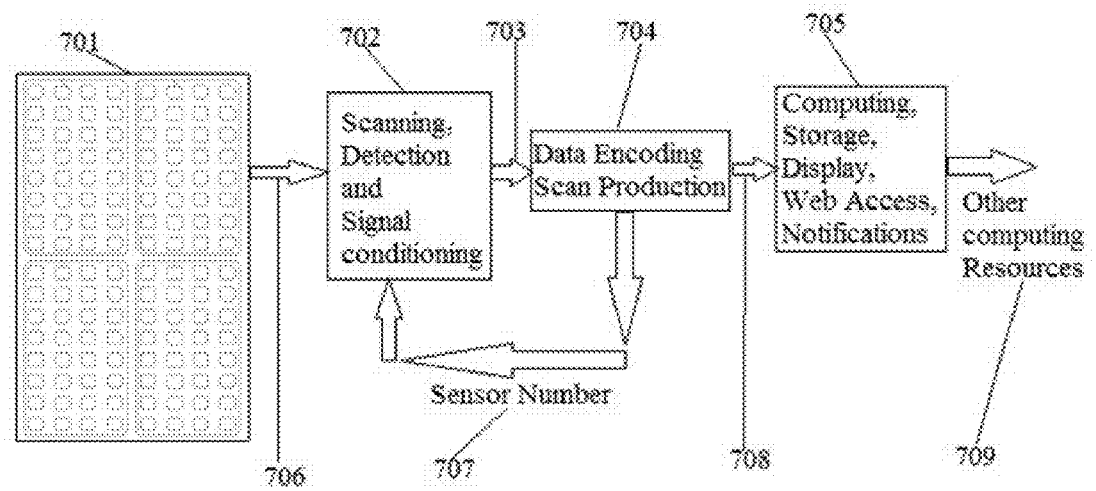
FIG. 7 shows a block diagram of an embodiment of a system as described in the summary.

FIG. 7 shows a four-segment sensor array in plan view, followed by the components in block form that make up an entire system in one embodiment. Referring now to FIG. 7, the four-segment array 701 is such that each segment has 4×8 sensors for a total number of sensors of 128. These are conveyed by means of wires 706 from each sensor to the scanning, detection and signal conditioning 702, which sends a single sensor signal via 703 for data encoding and scan address production 704, which produces the address of the next sensor 707, and takes the current address and data via 708 to 705 usually implemented by a computer. There 705 makes that data available for display notification, local storage, display, web access, and other communication needs via 709. The output of 705 can provide data for other needs including cloud storage.

FIG. 8 shows a different embodiment in that a three-segment array of 96 sensors is considered. Referring now to FIG. 8, each segment 801, 802, 803 consists of four rows by eight columns of sensors for a total of 32 sensors. In this embodiment, each sensor is connected to a wire so that a row of eight sensors has eight wires 804 for a total twelve wires coming together to form cable 805. Cable 805 is the combination of each set of eight wires 804 coming together to form a bundle of 96 wires 806 that connects to the electronics 807. The analog signal from the addressed sensor is amplified and transmitted via 808 to the next circuit component (not shown in FIG. 8) for scanning, detection, and signal conditioning. Segment 802 would likely be called segment B. Since the darkened sensor is activated the third row can be interpreted as encoding $1010_2$ which is also encoded in Hexadecimal (or 16 base system as A). Because all the rest of the sensor are not activated they produce a value of 0 so we can represent the segment in base 16 as 00A00000.

A major expansion of computing power, but at a low cost, is possible with a Graphics Processor Unit. Using the same basic system to scan the sensor array, the higher computing power uses highly sophisticated computational Intelligence algorithms to identify patterns and associate them with a walk, fall, standing still or any motion on the carpet. For example, the system detects a fall after a walk given that no a-priori information is given regarding the subject or the subject's intent. Using computational intelligence, an algorithm can be used to detect that a fall has occurred. This requires that continuous monitoring, using scans to identify walking, non-walking and a fallen condition. Further processing of the data it is possible to calculate the number of steps taken, step velocity and distance between steps; in short characterize the gait. These can be done by counting the number of steps over a fixed distance noting the time at which those steps were taken, and dividing the time to traverse the fixed distance to determine the velocity. Storing these data on the cloud (or even locally) one can provide a monthly report or as needed, over a long time. These data can have diagnostic significance and can produce an assessment of fall risk.

Computational intelligence provides the discipline to identify walk, fall, no motion, and other motion. The latter takes care of those events that have little significance for the resident; for example, several people milling about can be identified, but the event has minor value in detecting gait characteristics or falls. The procedure requires data preparation, identification of features, choosing the best or optimum algorithm and testing.

In data preparation scans that are not complete or overlap with succeeding scans are removed and replaced with the nearest correct scan. A function on the scan, such as summing the active sensors converts the scan to a single point. Previously a window of the number of scans (usually six) has been determined and the data is then placed in units of convenient size.

Computational intelligence classifiers; Naïve Bayes, Multilayer Perceptron, Decision Tree J48, and Logistic Function can be applied so that the features obtained can be assessed to determine that a walk, a fall, no motion and other can be determined.

Results of the classifier performance is usually placed in a contingency table. However, in operation we assume that the testing has been done and that we have chosen and are using the best classifier. Walk data can be identified as that "good" data that can be used to determine gait characteristics as described elsewhere, stored for a later periodic report on the gait characteristics. Fall data can be distributed on an urgency basis to those who have been selected earlier with identifiable tasks to report. These may be to go to the resident's house to assist the resident with their needs, find emergency services to assist the resident, and carry out the required assistance of the resident. The no motion and other motion can be stored for later use if desired.

Measuring Gait Parameters—The techniques used to estimate the gait parameters of walking speed, stride time, and stride length required measuring only the distance travelled, and elapsed time. Additionally, we used computational rules to determine the number of footfalls.

The techniques used to estimate the gait parameters of walking speed, stride time, and stride length required measuring only the distance travelled, and elapsed time. Additionally, we used computational rules to determine the number of footfalls.

Foot Falls—For measurement of gait parameters, in addition to the walk time and distance, we found that determining the footfalls is a key factor. Footfalls are obtained by grouping the scanned frames in a window of size WN, and counting the number of active sensors above the threshold (TH). The window size WN is determined based on the walking speed at constant scanning rate (14 frames per second). A subject performs good walk sequences (non-pathological scans), to find the average speed (distance/ time), from which one can determine the proper window size WN to determine the footfall.

Walking Speed requires determining the first and last active sensors from a set of good scans; this provides distance walked, D and the time elapsed, T. Walking speed V can be calculated by dividing the distance by the time according the equation:

$$V = \frac{D}{T} \quad (1)$$

V: walking Speed
D: Distance Travelled, and
T: Time Elapsed

Step and Stride Time. Step time is the time elapsed from first contact of one foot to the first contact of the opposite foot, is computed by dividing the Time Elapsed (T) by the number of Steps, $N_{steps}$ (Footfalls—1) as in:

$$T_{step} = T/N_{steps} \quad (2)$$

And compute the Stride Time as:

$$T_{STRIDE} = 2 * T_{STEP} \quad (3)$$

Step and Stride Length. Step length L step is measured by dividing the distance travelled by the number of steps.

It is possible to use the sensor system to distinguish the left and right foot by finding the centroid of each footfall to determine the location of left and right footsteps. Using the equations developed above, the algorithm below obtains the gait parameters. In the algorithm we first read a frame of data (corresponding to one scan of the carpet segments), and then converted into binary to build matrix of "0" and "1", where "1" represents an active sensor. We then placed the frames in a group of lengths WN, and then find the total count of active sensors, which if within a certain threshold defined experimentally will be marked as footfall.

Identifying good walks requires eliminating bad walks. In rare occasions bad walks might not be easily disposed of by identifying pathological scan. In some the scans system was unable to detect a footfall in the middle of the walk, which affected our calculations, and because we had so much more data we dropped this bad walk. This test also helped when the system could detect footfalls at the middle of the walk range but not detect the footfall at the beginning or the end of the walk trial; these were still considered a valid walk. In this case the number of steps, time elapsed, and distance travelled will be less than expected, but it will not affect computing the walking speed, stride length and stride time.

ALGORITHM 1

Gait Parameters Extraction

NumberofFrames= 0;
$N_{active}$ (active sensors)= 0;
Window size of frames= $W_N$
For each frame f {
    Parse the frame into binary data
    Build a matrix data structure
    ++NumberofFrames
    If (NumberofFrames == $W_N$){
        Count number of active sensors $N_{active}$
            If( $N_{active}$ >= TH)
            ++Footfalls
        If( f == Last Frame){
            Time= FinishTime$_{LF}$ - StartTime$_{FF}$
            Distance=LastActiveSensorLocation −

ALGORITHM 1-continued

Gait Parameters Extraction

First ActiveSensorLocation;
            Calculate the Number of Steps (Footfalls −1)
        Calculate the walking Speed (1)
        Calculate the step time; stride time (2), (3)
        Calculate Step length and stride length (4), (5)
    }
}
Output: Gait Parameters In one embodiment, the system consists of a sensor array made into four segments A, B, C, and D. Each segment is connected to data acquisition system, which is connected to a Jetson TK1 computer through serial to USB connector. The data acquisition system scans the carpet and provides the serial data in HEX format. Each frame is one scan over the 128 sensors where a frame consists of data, segment labels, start (S) and end (E) markers. Once received by the Jetson TK1 board, a software program written in Java parses the frame data and stores the data in different formats: raw, Comma Separated Value (CSV) of active sensors, matrix, sum matrix, and relational database using MySQL database management system. The latter format helps show live and history data on demand.

The hardware computing power allowed us to build a web application to display the activity on the smart carpet in quasi real-time by configuring the Jetson TK1 board as a database (MySQL) and a web (Apache) server. This is a substantial improvement compared to using a Sheevaplug communicating with a remote computer using a client server configuration with some delay.

We processed the data to detect a fall and sent a notification accordingly. We were able to send notifications via E-mail, and Short Messaging Service (SMS) free of charge. Other tools of notifications are possible like paid SMS, pager, and phone calls.

We then built a training dataset using both the video recorded and the fall detection algorithms to train and test the performance a set of computational intelligence classifiers: Naïve Bayes, Multilayer Perceptron, Decision Tree J48 (also known as C4.5 classifier), and Logistic Function. We used the Weka framework, which is a collection of machine learning algorithms for data mining tasks. Weka contains tools for data pre-processing, classification, regression, clustering, association rules, and visualization.

We used Weka to analyze and evaluate different computational intelligence algorithms or models to help detect a fall. Below we will briefly describe the operation of the selected algorithms: Naïve Bayes, Logistic, Multilayer perceptron, and decision tree J48.

Naïve Bayes methods are a set of supervised learning algorithms based on applying Naïve Bayes' theorem (Bayes' rule of conditional probability) with the "naive" assumption of independence between every pair of features. It uses Maximum A Posteriori (MAP) estimation to estimate the probability distribution, the prior and the likelihood probabilities. Combining both the prior and the likelihood probabilities to form a posterior probability produces the final classification.

In linear regression, classes are expressed as a linear combination of the attributes, with predetermined weights. It then predicts the data based on a threshold. Of interest is the difference between actual and predicted values. The weights are chosen to minimize the sum of the squares of these differences over all training data. In logistic regression, the original classes replaced by a target variable and resulting values are no longer constrained to a binary interval, but can lie anywhere from negative infinity and positive infinity.

A multilayer perceptron is a feedforward artificial neural network model that maps sets of input data onto a set of appropriate output. It is a modification of the standard linear perceptron in that it uses three or more layers of nodes with nonlinear activation functions (sigmoid for example), and it can distinguish data that is not linearly separable, or separable by a hyper-plane. Learning occurs in the perceptron by changing connection weights after each piece of data is processed, based on the amount of error in the output compared to the expected result. This is an example of supervised learning, and is carried out through backpropagation, a generalization of the least mean squares algorithm in the linear perceptron.

The J48 decision trees algorithm is a Weka implementation of a decision tree learner. A decision tree is a predictive machine-learning model that decides the target value of a new data instance based on various attribute values of the available data. The internal nodes of a decision tree denote the different attributes; the branches between the nodes tell us the possible values that these attributes can have in the data instances, while the terminal nodes tell us the classification. In order to classify a new data instance, it first needs to create a decision tree based on the attribute values of the available training data. Therefore, whenever it encounters a set of training instances it identifies the attribute that discriminates the various instances most clearly with highest gain. Among the possible values of this feature, if there is any value for which the data instances falling within its category have the same value for the target variable, then we terminate that branch and assign to it the target value that we have obtained. For the other cases, we then look for another attribute that gives us the highest information gain. Hence, we continue in this manner until we either get a clear decision of what combination of attributes gives us a particular target value or we run out of attributes. In the event that we run out of attributes, or if we cannot get an unambiguous result from the available information, we assign this branch a target value that the majority of the items under this branch possess.

We conducted the experiments to determine the performance of the fall detection algorithms and classifiers. We found that the confusion matrix of all methods and algorithms represents a base for the performance analysis. The confusion matrix is more commonly named a contingency table. In our case we have two classes (fall, no fall), and therefore a 2×2 confusion matrix. The matrix could be arbitrarily large. The number of correctly classified instances is the sum of diagonals in the matrix: all others are incorrectly classified. Table 1 shows a two-class confusion matrix. The relation between Predicted and Actual classes gives four outcomes. The true positives (TP) and true negatives (TN) are correct classifications. A false positive (FP) is when the outcome is incorrectly predicted as fall (or positive) when it is actually no fall (negative). A false negative (FN) is when the outcome is incorrectly predicted as negative when it is actually positive. The true positive rate is TP divided by the total number of positives, which is TP+FN. The false positive rate is FP divided by the total number of negatives, which is FP+TN. The overall success rate is the number of correct classifications divided by the total number of classifications: (TP+TN)/(TP+TN+FP+FN).

TABLE 1

The Confusion Matrix For Classifiers

| | | Predicted Class | |
|---|---|---|---|
| | | Yes: Fall | No: No fall |
| Actual Class | Yes: Fall | True Positive (TP) | False Negative (FN) |
| | No: No Fall | False Positive (FP) | True Negative (TN) |

Another two measure we can determine form the confusion matrix is the Specificity and Sensitivity. Sensitivity refers to the proportion of patterns with actual patterns with a fall that has been classified as falls (TP). Specificity refers to the proportion of actual patterns with no fall that has been classified as no fall, which is 1—FP.

The J48 decision trees classifier outputs a decision tree or set of rules. The tree employs a case's attribute values to map it to a leaf designating one of the classes. Every leaf of the tree is followed by a cryptic (n) or (n/m). The value of n is the number of instances in the data that are mapped to this leaf, and m (if it appears) is the number of them that are classified incorrectly by the leaf.

We used a Jetson TK1 computer with an embedded Linux development platform produced by NVIDIA featuring a Tegra K1 SoC (System on Chip) (CPU+GPU+ISP in a single chip). It requires 12V DC power. As with the well-known Raspberry Pi, the Jetson TK1 development board has some PC-oriented features such as SATA, mini-PCIe and a fan to reduce heat to allow continuous operation under heavy workloads. The board is five-inch-by-five-inch with typical power consumption between one to five Watts.

Figure 9:
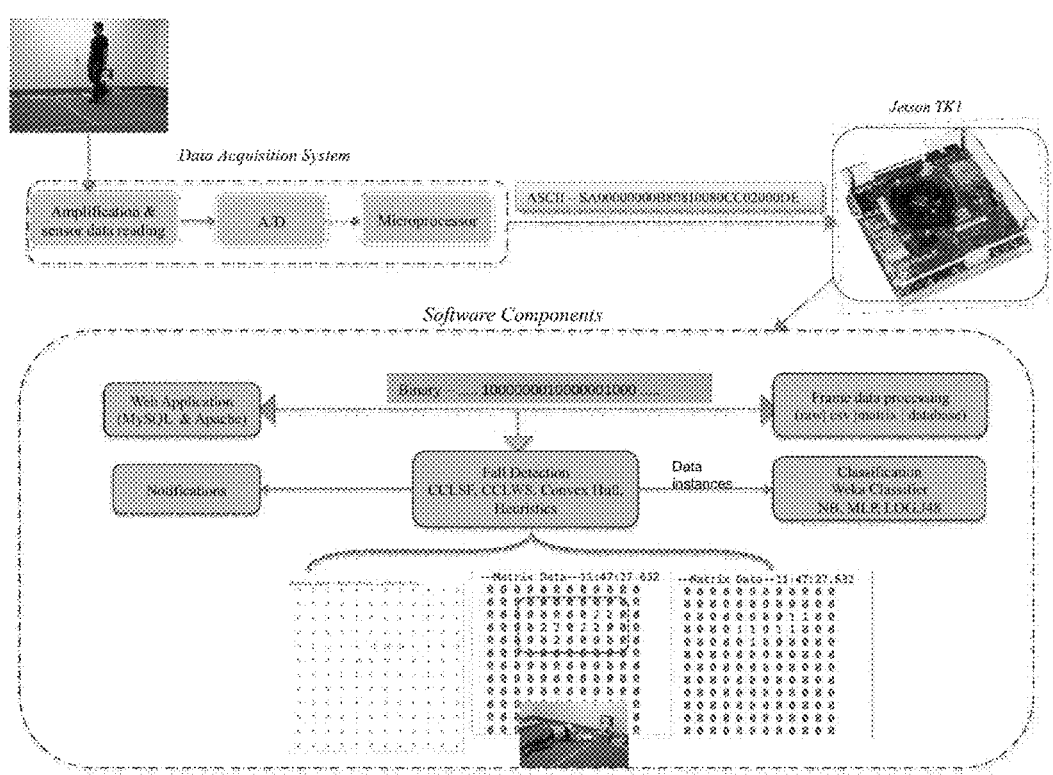
FIG. 9 shows a system setup and software components in one embodiment.

FIG. 9 shows a system setup and software components in one embodiment. Referring now to FIG. 9, sensors of the carpet were scanned and the data was obtained by the Jetson TK1 board as a series of frames of length nineteen bytes at a speed of 19.2 Kbps.

We convert the data to different formats for its further analysis, storage, and display. The details of conversion and storage techniques are in three different formats: raw data with timestamp, matrix, and CSV (Comma Separated Value). Our work enhanced both storage and display of carpet data. We used a MySQL database management system to store the carpet active sensor data, and Apache webserver to help produce the web application to display the carpet data on a browser. Besides the database, we used the two storage formats consisting of frames of sensor data time-stamped as read by the data acquisition board. The matrix shows each frame of sensor data such that "0" means sensor not activated and "1" means the sensor is activated. The form of the matrix follows that of the carpet layout on the floor, which provides positional information. We had to provide computing resources for database storage, carpet display and notification. The latter is to notify authorized people of a potentially dangerous occurrence.

We developed a web application to display activity in the browser. Using a database management system, MySQL, we were able to save active sensor data with their corresponding locations on the carpet into the database, and then query the data and display in the web browser using the Apache HTTP server. MySQL database was used on the Jetson TK1, which allowed access to the carpet data any time. This allowed us to display the occurrence of steps on the carpet instantly, and as desired. MySQL allows us to query the data any time so we can view the past events.

FIG. 9 also shows the stored sensors data in the database. We store the coordinates (x, y) and the location of the active sensors, the date and time of the insertion into the database, which usually requires negligible time. The database table structure follows that of Table 2 with the following fields, a field for unique id, Xcord, Ycord fields represent the location of the active sensors, and the Location field shows the numerical position of the sensor. The DateTime represents the time of insertion into the database. Our experiments show that this matches to a certain degree the time the board received the data frames from the data acquisition system. Hence, this allows for almost instant display of the occurrence of the steps on the web browser. Space was also provided for a de-identified designation of the volunteer subjects and experimental fall patterns used.

TABLE 2

Database View Of The Stored Active Sensors Data

| Id | Xcord | Ycord | Loc | DateTime | I | L | Z | PersonN | FallTypeName |
| --- | --- | --- | --- | --- | --- | --- | --- | --- | --- |
| 81332 | 2 | 4 | 34 | 2015-05-15 15:41:14 | 0 | 0 | 0 | Person4 | Tripping_to_FBD |
| 81333 | 2 | 8 | 66 | 2015-05-15 15:41:14 | 0 | 0 | 0 | Person4 | Tripping_to_FBD |
| 81334 | 2 | 4 | 34 | 2015-05-15 15:41:14 | 0 | 0 | 0 | Person4 | Tripping_to_FBD |
| 81335 | 3 | 3 | 27 | 2015-05-15 15:41:14 | 0 | 0 | 0 | Person4 | Tripping_to_FBD |
| 81336 | 2 | 4 | 34 | 2015-05-15 15:41:14 | 0 | 0 | 0 | Person4 | Tripping_to_FBD |
| 81337 | 3 | 3 | 27 | 2015-05-15 15:41:14 | 0 | 0 | 0 | Person4 | Tripping_to_FBD |
| 81338 | 4 | 6 | 52 | 2015-05-15 15:41:14 | 0 | 0 | 0 | Person4 | Tripping_to_FBD |
| 81339 | 7 | 6 | 55 | 2015-05-15 15:41:14 | 0 | 0 | 0 | Person4 | Tripping_to_FBD |

Table 2 shows the id, coordinates, location, and datetime that the data frame was received by the board after receiving active sensor. We do also have a way to designate the specific experiments and fall type. Subjects' names were de-identified and a placeholder was stored for experimental purposes.

In order to alert the authorized party for any possible fall occurrence, many ways of notifications were developed and tested. Visual and live display of the person activity is shown in Table 6. Another approach is to send email to one or more predetermined personnel. Also, an e-mail can be sent to a cell phone numbers as SMS. All these are free of charge. However, we can also use a commercial or non-free notification tool like paging, paid SMS, and phone calls.

To assess the new system's ability to detect falls, we collected data from 10 adult volunteers. We then built a training dataset to train and test the performance of a set of computational intelligence algorithms: Bayes Network, Multilayer Perceptron, Decision Tree (J48 aka C4.5) and Logistic function. The following describes data collection, analysis, building training and testing data, and the performance of each algorithm.

Figure 10:
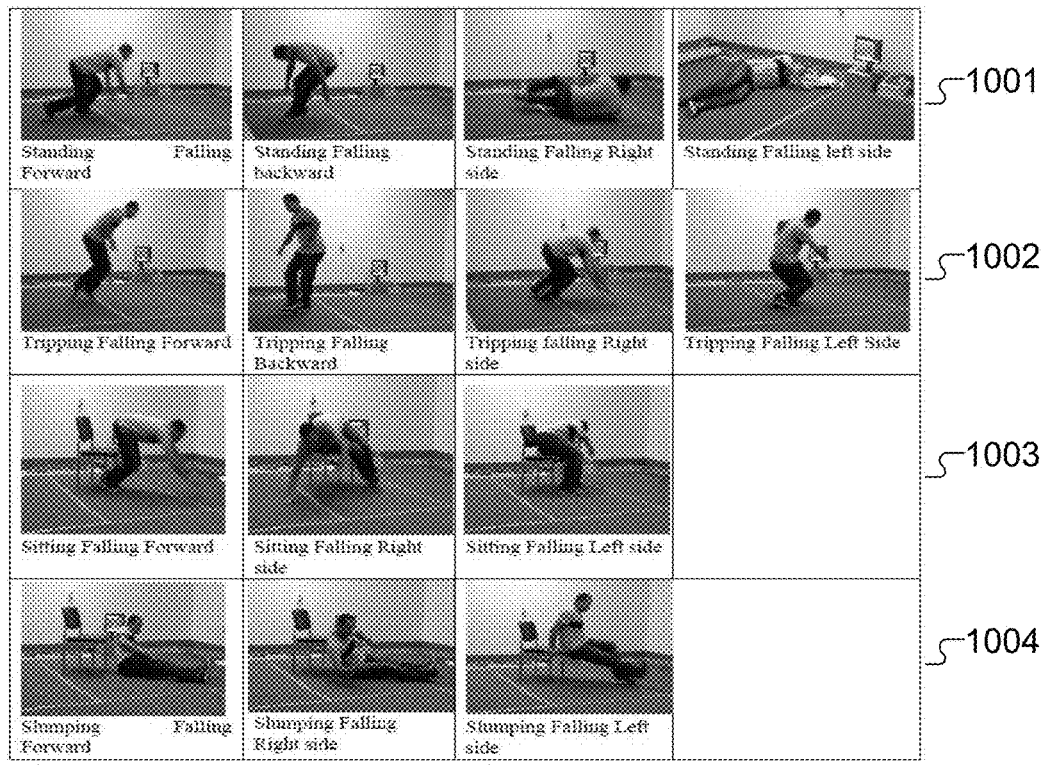
FIG. 10 shows the detailed fall patterns performed in one embodiment.

Ten volunteers performed fourteen falling patterns described by four categories: falling from standing, falling from tripping, falling from sitting on a chair, and falling from slumping from a chair. FIG. 10 shows the detailed fall patterns performed in one embodiment. Referring now to FIG. 10, the first row 1001 describes the standing to falling patterns (four patterns). The second row 1002 describes the tripping to falling patterns (four patterns). The third row 1003 describes the sitting to falling patterns (three patterns). The fourth row 1004 describes the slumping to falling patterns (three patterns).

Figure 11:
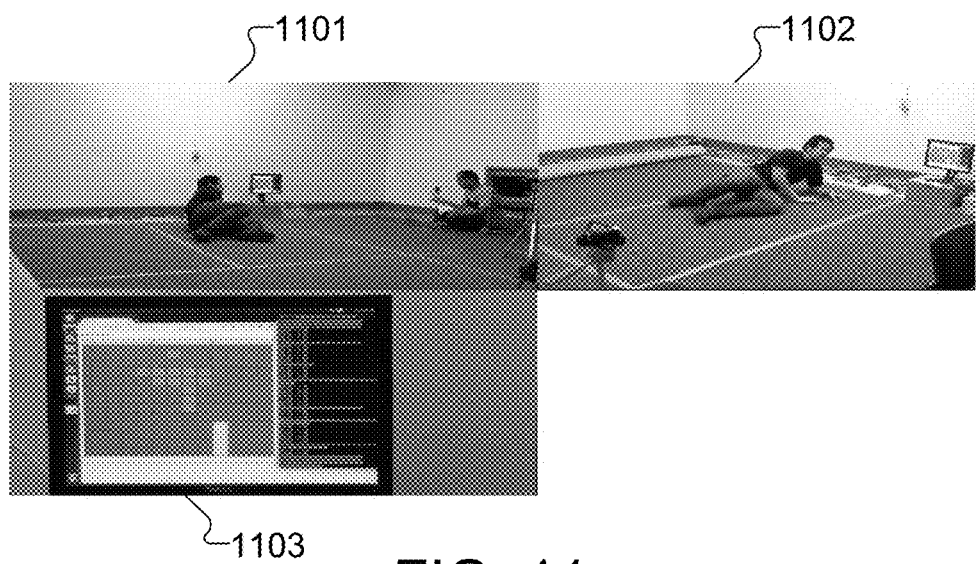
FIG. 11 shows the views used to record the video of the fall patterns of FIG. 10.

FIG. 11 shows the views used to record the video of the fall patterns of FIG. 10. Referring now to FIG. 11, each fall was performed by ten volunteers. We recorded a video in two views for the fall pattern and one for the occurrence of the steps on the developed web application showing the active sensors. The top left view 1101 shows the front and left side view of the person performing the fall pattern. The top right view 1102 shows the back and right side of the person performing the fall pattern. 1103 shows a screen capture of the display of the fall shown in view 1101 and view 1102. We used this data to study and develop fall detection algorithms. The outputs of the experiments are the video files, database files for all active sensor data, and the raw data files from the frames obtained from the data acquisition system.

The data from the ten volunteers consisted of fourteen fall patterns replicated by each volunteer so that we had ten instances of each fall pattern. We used this raw data obtained from the data acquisition system, converted into a matrix, and used both data in different fall detection algorithms.

An important strategy is to use the connected component-labeling algorithm to build training data for classifiers. We developed a new approach using a window of number of frames of different sizes (WS). The work done by was focused on a single frame. We first counted the number of active sensors per frame and used different window sizes. Then, we used the same approach to find the connected component within that set of windows. The algorithm declares a fall occurs when the size of largest contiguous sub region is found to be greater than a predefined threshold (TH), where the threshold was found experimentally. We developed and studied three main fall detection algorithms: Connected Component Labeling (CCL) with different window sizes, the Convex Hull area also with different window size of number of frames, and a heuristic algorithm based on active sensors count and their neighborhood characteristics.

In connected component labeling as described, we applied the same procedure for both single frames and window size encompassing variable number of frames. In our work, we modified the algorithm to account for the active sensors on the sides of the carpet.

In the convex hull area algorithm, we used a windows size of number of frames to form an array list of active sensors, and then applied the quick convex hull algorithm. We found the points forming the convex hull (polygon) for the set of active sensors on the carpet. We calculated the area of the polygon according to the shoelace algorithm. To detect a fall, we ran the algorithm for different window sizes and thresholds.

In the heuristic algorithm, we converted the array of sensors data into a matrix format. Then we counted the number of active sensors that are contiguous in a row or column, and if that count meets or exceeds some threshold (TH), we mark it as a fall. We evaluated and compared the performance of all the algorithms above.

Our goal is to apply computational intelligence to a system for personnel monitoring. We used a set of classifiers from WEKA framework and trained them by a training data generated from the algorithms discussed above. Issues include how we generated and prepared the data, what classifiers we used and what metric we measured from each classifier.

We used eight patterns (Walk-Fall) of the fourteen patterns performed by the ten volunteers to generate the training and testing data. For each subject we identified walk, fall, stand, and walk again. We used the portion of walk and fall for this analysis. We used both the active sensors count and the connected component size, as well as different windows size of number of frames (WS=1, 8) with threshold values (TH=4, 7) respectively. In addition to these criteria, we used the video recorded for each pattern to label the training and testing data.

Table 3 shows the beginning portion of the training data file used to train the classifier in WEKA framework. The file starts with the dataset's name indicated by the @relation tag, the attribute information using @attribute shows the attributes or features we used to predict a fall: SF_Count: Single frame (WS=1) active sensors count. SF_CCL: Single frame (WS=1) connected component size. WS8_Count: multiple frames (WS=8) active sensors count. WS8_CCL: multiple frames (WS=8) connected component size. The last entry is the class: yes (Fall), and no (No Fall). A similar file structure is used for the testing dataset. Weka explorer can accept different data files and formats. We used the native data storage ARFF format. The @data line denotes the start of the training or testing data the list of the instances with commas separating the attribute values.

TABLE 3

Sample Dataset File For Weka Framework

@RELATION FALL
@ATTRIBUTE SF_COUNT    NUMERIC
@ATTRIBUTE SF_CCL      NUMERIC
@ATTRIBUTE WS8_COUNT   NUMERIC
@ATTRIBUTE WS8_CCL     NUMERIC
@ATTRIBUTE class       {yes, no]
@DATA
Ø, Ø, Ø, Ø, no
Ø, Ø, 1, Ø, no
Ø, Ø, Ø, Ø, no
Ø, Ø, Ø, Ø, no
Ø, Ø, Ø, Ø, no
Ø, Ø, Ø, Ø, no
Ø, Ø, 2, Ø, no
Ø, Ø, 7, Ø, no
2, Ø, 3, Ø, no
1, Ø, 5, Ø, no
Ø, Ø, Ø, Ø, no
Ø, Ø, Ø, Ø, no
Ø, Ø, Ø, Ø, no
Ø, Ø, Ø, Ø, no
Ø, Ø, Ø, Ø, no
4, 3, 5, 3, no
1, Ø, 19, 9, yes
Ø, Ø, Ø, Ø, no
Ø, Ø, 1, Ø, no
Ø, Ø, 1, Ø, no
Ø, Ø, 1, Ø, no
Ø, Ø, 1, Ø, no
1, Ø, 3, Ø, no
Ø, Ø, 3, 2, no
1, Ø, 2, Ø, no
1, Ø, 3, 3, no
Ø, Ø, 3, Ø, no
Ø, Ø, 3, Ø, no
Ø, Ø, Ø, Ø, no
Ø, Ø, 4, Ø, no
Ø, Ø, 1, Ø, no
Ø, Ø, 3, Ø, no TABLE 3-continued Sample Dataset File For Weka Framework Ø, Ø, Ø, Ø, no
1, Ø, 2Ø, 9, yes
2, 2, 22, 8, no
2, Ø, 2Ø, 8, no We used Weka to analyze and evaluate different computational intelligence algorithms or models to help detect a fall. Weka supports the following classifiers: Naïve Bayes, Logistic, Multilayer perceptron, and decision tree J48/04.5 classifier. We used the generated datasets (training and test) for the falling patterns to train on the selected classifier. We measured the accuracy of each classifier by calculating a 2×2-confusion matrix or (contingency table) that describes the performance of the classifiers. Sensitivity and Specify were calculated and studied. We visually viewed the set of classification rules used by generating the decision tree from the J48 decision trees classifier.

We used three different testing options: Train and test, Ten-Fold Cross-validation, and Percentage split. We evaluated the accuracy of the classifier to the dataset provided based on the contiguous table provided. We decide what feature(s) or attribute(s) contribute most in the classifier decision for fall detection. Most classifiers should run within reasonable time compared to the size of the dataset. However, classifiers with a testing option that requires less computing resources are preferred. For example, Ten-Fold cross-validation needs more time compared to the others. It breaks the data into ten sets of size n/10 (n: number of the data set vectors or instances), and then trains on nine datasets and tests on one, repeats ten times and takes a mean accuracy. The next options, train and test option, we left 10% of the dataset for testing and used the 90% for training. However, in percentage split, the training and testing portion can be automated and randomly processed without biasing, which makes for better classification. We compared the performance classifiers for each of these three testing options.

Figure 12:
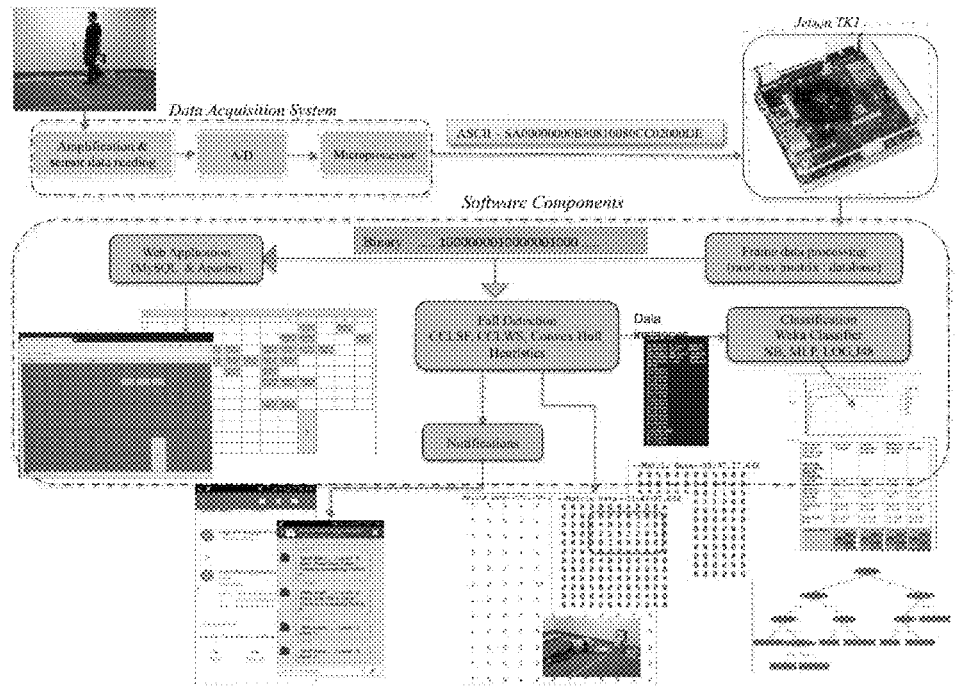
FIG. 12 shows the electronics front end and the computational intelligence in one embodiment.

FIG. 12 shows the electronics front end and the computational intelligence in one embodiment. Referring now to FIG. 12, the electronics front end, the Jetson TK1 board, and the software providing computational intelligence to the system, and results (notifications, quasi real-time display, and intelligence classifiers) are shown. The work here reflects the use of formal computational intelligence techniques to identify the activity of the personnel on the floor.

Speed is important in smart carpet technology to provide rapid data evaluation, display, and notification of the results. In particular, high computing speed is essential for evaluating large amounts of data for purpose of making a timely decision.

The Jetson TK1 computer provides more processing power than small processors like the raspberry pi, allowing sophisticated algorithms and programs to run concurrently. Reading data from the data acquisition system takes place within one full scan of all the sensors. The new faster system processes data within a shorter time frame to provide for quasi-real-time processing.

We configured the Jetson TK1 board as a web and database server. This allows us to use web-based resources for data acquisition purposes and enable a display program that can be accessed locally and remotely. Using the Jetson TK1 board as s database and web server made display almost instantly available. The moment a step occurs it shows up on the browser.

Table 4 (below) shows sample of the sensor data (frames) obtained from the data acquisition system by a volunteer performing the "Tripping Falling Backward" pattern. The figure shows seven frames, each time-stamped with the time read by the Jetson TK1 board. There is only one active sensor in this set of frames. Sensor 66 corresponds to C2 according to the frame SA00000000 B00000000C20000000D00000000E.

TABLE 4

Sample Of The Sensor Data (Frames)

SA00000000B00000000C00000000D00000000E, 2015-05-15 15:41:18.988
SA00000000B00000000C00000000D00000000E, 2015-05-15 15:41:19.112
SA00000000B00000000C00000000D00000000E, 2015-05-15 15:41:19.236
SA00000000B00000000C00000000D00000000E, 2015-05-15 15:41:19.361
SA00000000B00000000C00000000D00000000E, 2015-05-15 15:41:19.485
SA00000000B00000000C2 0000000D00000000E, 2015-05-15 15:41:19.61
SA00000000B00000000C00000000D00000000E, 2015-05-15 15:41:19.746

Table 5 (below) shows the data after we parse the frames, and is the database view of the same set of frames shown in Table 4. These frames give rise to an array showing only active sensors data (corresponds to binary "1"). So that the second from the bottom frame in Table 4 (above), time-stamped by (15:41:19.61) compared to the database row with id number 81371 in Table 5. This shows that sensor in row two, column eight was activated. This is then displayed on the browser instantly. Display of data can be delayed but not made faster.

Contrasting sensors data acquisition and displaying it (in milliseconds) to the video recorded for those experiments supports the apparent instantaneous display. In normal operation, we insert the data into the database, from which we generate the display. This results in a loss of time synchrony. However, a substantial benefit is the ability to recall the data when desired. Other work in the lab is data mining, displaying sensors data in the cloud, and developing a feature-rich portal. Only one record inserted corresponds

TABLE 5

Data After Parsing The Frames

| Id | Xcord | Ycord | Loc | DateTime | I | L | Z | PersonN | FallTypeName |
|---|---|---|---|---|---|---|---|---|---|
| 81366 | 3 | 6 | 51 | 2015-05-15 15:41:17 | 0 | 0 | 0 | Person4 | Tripping_to_FBD |
| 81367 | 2 | 8 | 66 | 2015-05-15 15:41:17 | 0 | 0 | 0 | Person4 | Tripping_to_FBD |
| 81368 | 3 | 6 | 51 | 2015-05-15 15:41:17 | 0 | 0 | 0 | Person4 | Tripping_to_FBD |
| 81369 | 2 | 8 | 66 | 2015-05-15 15:41:18 | 0 | 0 | 0 | Person4 | Tripping_to_FBD |
| 81370 | 2 | 8 | 66 | 2015-05-15 15:41:18 | 0 | 0 | 0 | Person4 | Tripping_to_FBD |
| 81371 | 2 | 8 | 66 | 2015-05-15 15:41:19 | 0 | 0 | 0 | Person4 | Tripping_to_FBD |

Table 6 shows the date and time stamps of the active sensors data for the "Tripping Falling Backward" pattern.

to the active sensor 66 or located at x=2, y=8 in the Cartesian coordinates (see Table 6 below).

TABLE 6

Live View Of The Carpet Live Data Display

| | A | | | | B | | | | C | | | |
|---|---|---|---|---|---|---|---|---|---|---|---|---|
| | 0 | 1 | 2 | 3 | 0 | 1 | 2 | 3 | 0 | 1 | 2 | 3 |
| 0 | | | | | | | | | 2015-05-15 15:41:15 | | 2015-05-15 15:41:10 | |
| 1 | | | | | | | 2015-05-15 15:41:15 | | 2015-05-15 15:41:16 | | | 2015-05-15 15:41:09 |
| 2 | | | 2015-05-15 15:41:13 | 2015-05-15 15:41:14 | | | 2015-05-15 15:41:15 | 2015-05-15 15:41:17 | 2015-05-15 15:41:19 | 2015-05-15 15:41:10 | | |
| 3 | | | 2015-05-15 15:41:15 | 2015-05-15 15:41:17 | 2015-05-15 15:41:17 | | 2015-05-15 15:41:17 | 2015-05-15 15:41:16 | | | | |
| 4 | | | | 2015-05-15 15:41:16 | | | 2015-05-15 15:41:17 | | | | | |
| 5 | | | | | | | 2015-05-15 15:41:16 | 2015-05-15 15:41:15 | 2015-05-15 15:41:16 | | | |
| 6 | | | | | | | | | | | | |
| 7 | | | | | | | 2015-05-15 15:41:14 | 2015-05-15 15:41:15 | | | | |
| 8 | | | | | | | | | D | | | |
| 9 | | | | | | | | | | | | |

TABLE 6-continued

Live View Of The Carpet Live Data Display

| | A | | | | B | | | | C | | | |
|---|---|---|---|---|---|---|---|---|---|---|---|---|
| | 0 | 1 | 2 | 3 | 0 | 1 | 2 | 3 | 0 | 1 | 2 | 3 |
| 10 | | | | | | | | | | | | |
| 11 | | | | | | | | | | | | |

Only active sensor data is displayed to show the steps of fall behavior. This view has the date and time of the inserted data into database. Each rectangle represents a sensor.

Fall detection assumes a responsibility to notify an authorized party that a fall has occurred. An emergency notification text received on a smartphone as SMS or an email may be sent to report fall occurrence. The message and levels are configurable. Phone, pager, and commercial SMS can be used to send alert and notification. We have confirmed that message receipt is nearly instantaneous. The average time for email notification was 2.8 seconds, with similar times for with SMS messaging.

Figure 13:
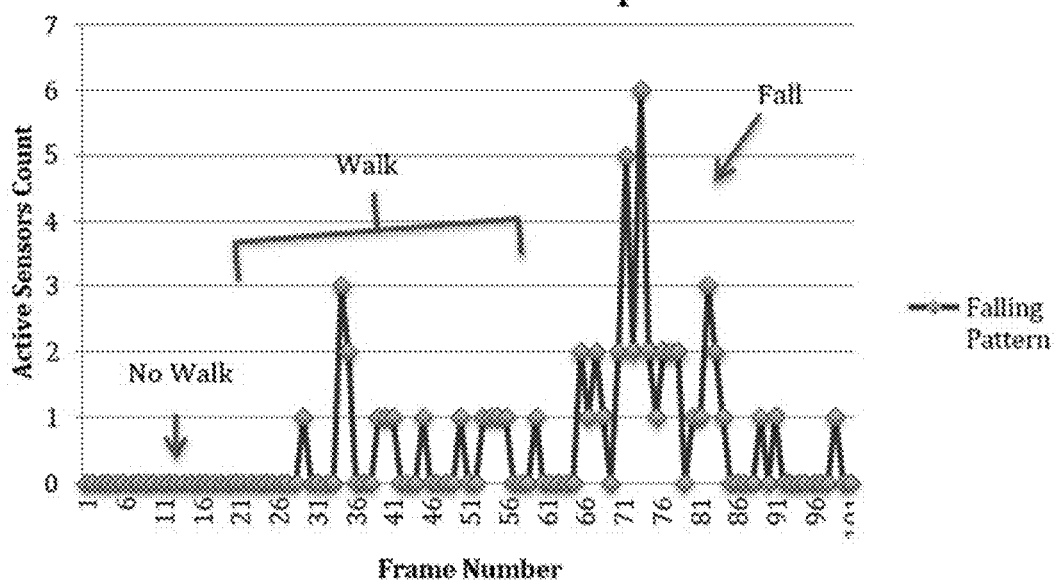
FIG. 13 shows the count of the active sensors in each frame obtained for the falling pattern "Tripping Falling Backward" for a period of 101 frames (fourteen seconds) in one embodiment.

To assess the new system ability to detect falls, we collected data from 10 adult volunteers. A volunteer to walk, trip, and fall backwards on to the carpet. FIG. 13 shows the count of the active sensors in each frame obtained for the falling pattern "Tripping Falling Backward" for a period of 101 frames (fourteen seconds) in one embodiment. Referring now to FIG. 13, as shown in the graph, at the beginning of the walk the count is zero, no activation of sensors. The moment the volunteer stepped on the carpet the sensors activated and were counted in each frame. Counts increase or decrease, depending on sensor activation, rate of scan relative to the walk, and noise. So low levels of count occur until a fall occurs causing a sharp increase in the number of active sensors noticed as seen in frames (71-76). Ideal scenario for a fall is a jump in the count of active sensors and then a sharp decrease to zero (Frames 92-100). We see that if the fallen walker stays stationary on the ground the counts are all zero.

Figure 14:
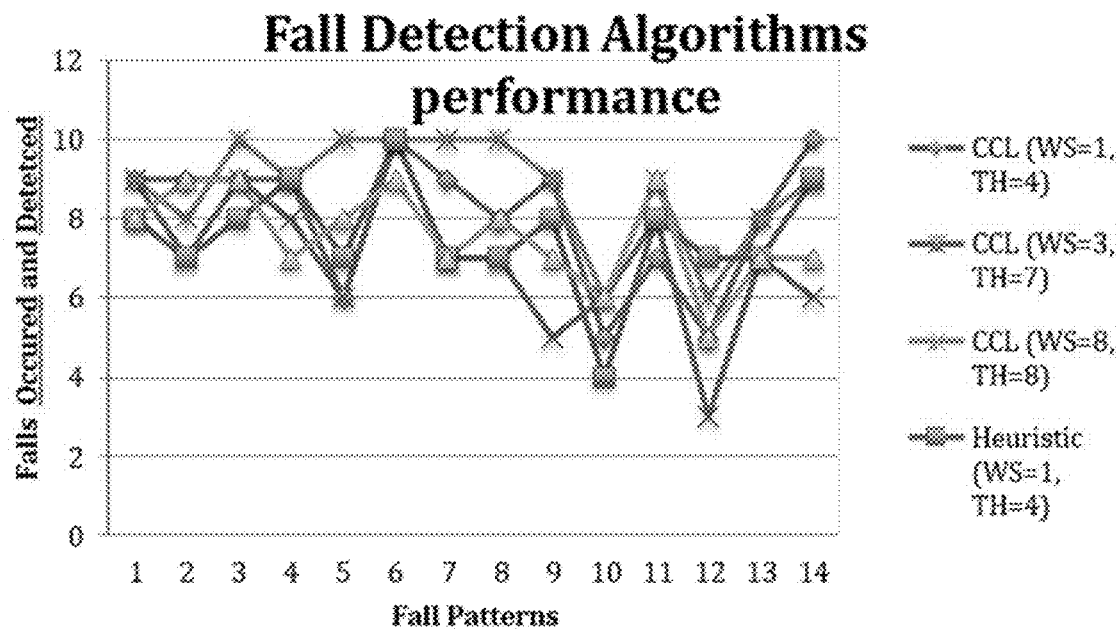
FIG. 14 shows the number of falls occurred and detected using five algorithms for the four falling patterns in one embodiment.

We measured the performance of five fall detection algorithms by counting the number of fall patterns that were detected as falls and we provided the sensitivity of the detected falls on all patterns done by ten volunteers. There were fourteen fall patterns, a sensitivity produced for the same of the detected falls, and a false negative rate (FNR) for patterns detected as no falls where falls occurred. This is shown in Table 7 (below), which also shows the window size and the threshold (TH) above which we say a fall occurs used for the decision. The shaded column in Table 7 shows the result of using the CCL-Multiple frames algorithm. At Window size (WS=8, and TH=8) we obtained a sensitivity or True Positive Rate (TPR) of 87.9% compared to lower window sizes. Also, it outperformed all other algorithms. FIG. 14 shows graphical view of the results detailed in Table 7. We believe there is a room for each algorithm for improvement, so we decided to use Computational Intelligence to get better detection and system analysis, discussed below.

TABLE 7

Fourteen Fall Patterns

| Fall Patterns | CCL-Single Frame (WS = 1, TH = 4) | CCL-Multiple Frames (WS = 3, TH = 7) | CCL-Multiple Frames (WS = 8, TH = 8) | HULL Area- (WS = 3, TH = 7) | Heuristic (WS = 1, TH = 4) |
|---|---|---|---|---|---|
| 1. Standing Falling Forward | 9 | 9 | 9 | 8 | 8 |
| 2. Standing Falling Backward | 9 | 7 | 8 | 9 | 7 |
| 3. Standing Falling Right Side | 9 | 9 | 10 | 9 | 8 |
| 4. Standing Falling Left Side | 9 | 8 | 9 | 7 | 9 |
| 5. Tripping Falling Forward | 6 | 6 | 10 | 8 | 7 |
| 6. Tripping Falling Backward | 10 | 10 | 10 | 9 | 10 |
| 7. Tripping Falling Right Side | 9 | 7 | 10 | 7 | 7 |
| 8. Tripping Falling Left Side | 8 | 7 | 10 | 8 | 7 |
| 9. Sitting Falling Forward | 9 | 5 | 9 | 7 | 8 |
| 10. Sitting Falling Right Side | 5 | 6 | 6 | 6 | 4 |
| 11. Sitting Falling Left Side | 7 | 8 | 9 | 9 | 8 |
| 12. Slumping Falling Forward | 5 | 3 | 6 | 5 | 7 |
| 13. Slumping Falling Right Side | 8 | 7 | 8 | 7 | 7 |

TABLE 7-continued

Fourteen Fall Patterns

| Fall Patterns | CCL-Single Frame (WS = 1, TH = 4) | CCL-Multiple Frames (WS = 3, TH = 7) | CCL-Multiple Frames (WS = 8, TH = 8) | HULL Area- (WS = 3, TH = 7) | Heuristic (WS = 1, TH = 4) |
|---|---|---|---|---|---|
| 14. Slumping Falling Left Side | 10 | 6 | 9 | 7 | 9 |
| Sensitivity (TPR) | 80.7% | 70% | 87.9% | 75.7% | 75.7% |
| FNR | 19.3% | 30% | 12.1% | 24.3% | 24.3% |

FIG. 14 shows the number of falls occurred and detected using five algorithms for the four falling patterns in one embodiment. Referring now to FIG. 14, CCL with WS=8, TH=8 shows best performance. It detects most occurred falls as falls with 87.9% sensitivity.

We used the data obtained from the previous sections to build the training and testing data for the classifiers described above. We calculate four attributes: active sensors count and connected region size each in both single frame (WS=1, TH=4), and multiple frames (WS=8, TH=7).

We measured the performance of different classifiers using three test options: (1) use training set, supplied test set, discussed below; (2) cross-validation ten folds, discussed below; and (3) percentage split 66%, discussed below.

Next, we compare these classifications and test options with the results obtained in Table 7.

We ran the Testing set for the four classifiers and then reevaluated the models or classifiers on the testing set. Table 8 (below) shows the performance of the classifiers when using training set.

TABLE 8

Classifier Performance Of The Training Set

| Training set: Yes: 100 No: 957 Total: 1057 | Naive Bayes Classifier | Logistic Regression Classifier | Multilayer Perceptron Classifier | J48 Classifier |
|---|---|---|---|---|
| Correctly Classified Instances | 992/1057 93.85% | 1025/1057 96.97% | 1031/1057 97.54% | 1029/1057 97.35% |
| Incorrectly Classified Instances | 65/1057 6.1495% | 32/1057 3.03% | 26/1057 2.46% | 28/1057 2.65% |
| True Positive Rate | Yes: 0.89 No: 0.944 | Yes: 0.77 No: 0.991 | Yes: 0.81 No: 0.993 | Yes: 0.79 No: 0.993 |
| False Positive Rate | Yes: 0.056 No: 0.11 | Yes: 0.009 No: 0.23 | Yes: 0.007 No: 0.19 | Yes: 0.007 No: 0.21 |
| | Classified as: | Classified as: | Classified as: | Classified as: |
| Confusion Matrix | Fall  No Fall | Fall  No Fall | Fall  No Fall | Fall  No Fall |
| Fall | 89  11 | 77  23 | 81  19 | 79  21 |
| No Fall | 54  903 | 9  948 | 7  950 | 7  950 |

Table 9 shows the performance of the classifier after re-evaluated on the testing set. Both tables have the same data that can mainly be obtained from the last row, the confusion matrix. All correct classifications are on the top-left (Fall classified as fall) to bottom-right (No Fall classified as no fall) diagonal. Everything off that diagonal is an incorrect classification of some sort.

TABLE 9

Classifier Performance Of The Testing Set

| Testing set: Fall: 10 No Fall: 86 Total: 96 | Naive Bayes Classifier | Logistic Regression Classifier | Multilayer Perceptron Classifier | J48 Classifier |
|---|---|---|---|---|
| Correctly Classified Instances | 79 82.2917% | 90/96 93.75% | 90/96 93.75% | 90/96 93.75% |
| Incorrectly Classified Instances | 17 17.7083% | 6/96 6.25% | 6/96 6.25% | 6/96 6.25% |
| True Positive Rate | Yes: 0.80 No: 0.826 | Yes: 0.7 No: 0.965 | Yes: 0.7 No: 0.965 | Yes: 0.7 No: 0.965 |
| False Positive Rate | Yes: 0.174 No: 0.20 | Yes: 0.035 No: 0.30 | Yes: 0.035 No: 0.30 | Yes: 0.035 No: 0.30 |
| | Classified as: | Classified as: | Classified as: | Classified as: |
| Confusion Matrix | Fall  No Fall | Fall  No Fall | Fall  No Fall | Fall  No Fall |
| Fall | 8  2 | 7  3 | 7  3 | 7  3 |
| No Fall | 15  71 | 3  83 | 3  83 | 3  83 |

Figure 15:
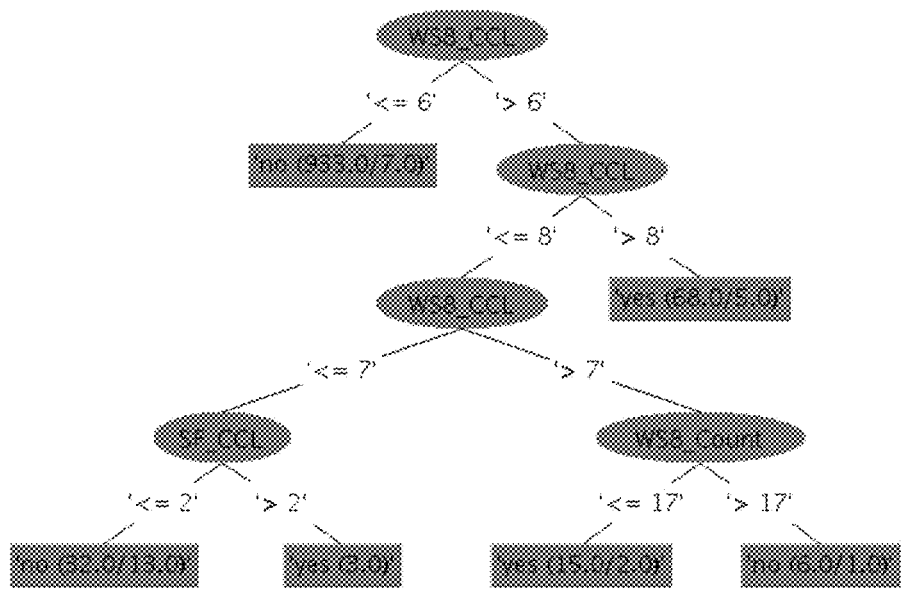
FIG. 15 shows a J48 pruned tree.

FIG. 15 shows the J48 pruned tree. Referring now to FIG. 15, the figure shows that the size of the connected component of windows of frames is the key attribute in deciding on fall detection. The size of the connected component for single frame and the sum of active sensors in a window of frames are of the same importance. And the active sensors count for a single frame show no importance.

We divided the dataset into ten parts, and we train on the nine parts, and test with the tenth part alone, and average the ten results. And each part in the dataset is used once for testing and nine times for training. Table 10 shows again the results for the classifiers and we note that for three of the classifiers with the ten-fold cross validation increases above 96% for correct classification and drop below 4% for incorrect classification of the same three classifiers. Regardless in all instances Table 10 shows improved results: higher percentage classification and lower in incorrect classification compared to the first of the three options, the train-test shown in Table 9.

TABLE 10

Classifier Performance Of The Ten-Fold Cross Validation

| All data set Fall: 110 No Fall: 1043 Total: 1153 | Naive Bayes Classifier | Logistic Regression Classifier | Multilayer Perceptron Classifier | J48 Classifier |
|---|---|---|---|---|
| Correctly Classified Instances | 1074/1153 93.15% | 1112/1153 96.44% | 1109/1153 96.18% | 1108/1153 96.10% |

TABLE 10-continued

Classifier Performance Of The Ten-Fold Cross Validation

| Incorrectly Classified Instances | 79 6.85% | 41/1153 3.56% | 44/1153 3.82% | 45/1153 3.90% |
|---|---|---|---|---|
| True Positive Rate | Yes: 0.845 No: 0.941 | Yes: 0.745 No: 0.988 | Yes: 0.809 No: 0.978 | Yes: 0.791 No: 0.979 |
| False Positive Rate | Yes: 0.059 No: 0.155 | Yes: 0.012 No: 0.255 | Yes: 0.022 No: 0.191 | Yes: 0.021 No: 0.209 |

| | Classified as: | | Classified as: | | Classified as: | | Classified as: | |
|---|---|---|---|---|---|---|---|---|
| Confusion Matrix | Fall | No Fall | Fall | No Fall | Fall | No Fall | Fall | No Fall |
| Fall | 93 | 17 | 82 | 28 | 89 | 21 | 87 | 23 |
| No Fall | 62 | 981 | 13 | 1030 | 23 | 1020 | 22 | 1021 |

Figure 16:
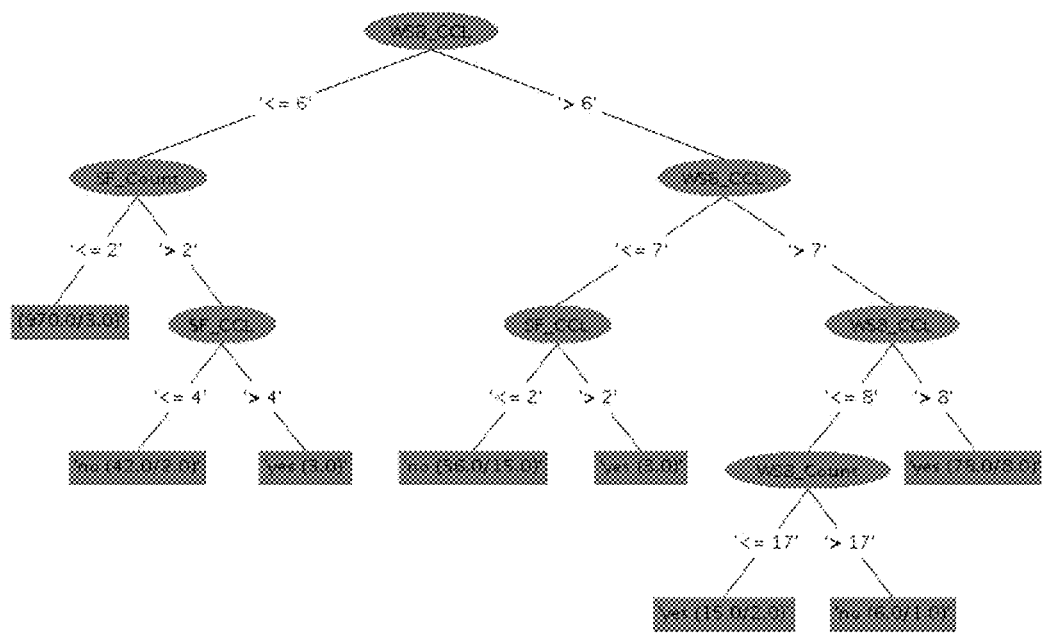
FIG. 16 shows a J48 pruned tree.

FIG. 16 shows the J48 pruned tree. Referring now to FIG. 16, the figure shows that the size of the connected component of windows of number of frames (WS=8) is the key attribute in deciding on fall detection. Furthermore, the second level is the count of active sensors, and they too play a discriminant role. In contrast, in FIG. 15, the count of active sensors for a single frame does not contribute to the classification.

The size of the connected component of windows of frames is the key attribute in deciding on fall detection. The count of active sensors for single frame has more effect compared to train-test.

The dataset is randomly split into training (66%), and testing (34%), we then run the classifiers on the training set and then re-evaluate on the testing set. Table 11 shows the performance of the four classifiers. And there is a slight improvement in the performance of each classifier: the correctly classified instances are slightly increased and the incorrectly classified instances are slightly decreased.

TABLE 11

Classifier Performance Of The 66% Percentage Split

All data set
Fall: 110
No Fall: 1043
Total: 1153
66% Train,

| 34%: 392 Test (Fall: 38, No Fall: 354) | Naive Bayes Classifier | Logistic Regression Classifier | Multilayer Perceptron Classifier | J48 Classifier |
|---|---|---|---|---|
| Correctly Classified Instances | 371/392 94.64% | 380/392 96.94% | 380/392 96.94% | 380/392 96.94% |
| Incorrectly Classified Instances | 21 5.36% | 12/392 3.06% | 12/392 3.06% | 12/392 3.06% |
| True Positive Rate | Yes: 0.842 No: 0.958 | Yes: 0.737 No: 0.994 | Yes: 0.737 No: 0.994 | Yes: 0.737 No: 0.994 |
| False Positive Rate | Yes: 0.042 No: 0.158 | Yes: 0.006 No: 0.263 | Yes: 0.006 No: 0.263 | Yes: 0.006 No: 0.263 |

| | Classified as: | | Classified as: | | Classified as: | | Classified as: | |
|---|---|---|---|---|---|---|---|---|
| Confusion Matrix | Fall | No Fall | Fall | No Fall | Fall | No Fall | Fall | No Fall |
| Fall | 32 | 6 | 28 | 10 | 28 | 10 | 28 | 10 |
| No Fall | 15 | 339 | 2 | 352 | 2 | 352 | 2 | 352 |

Figure 17:
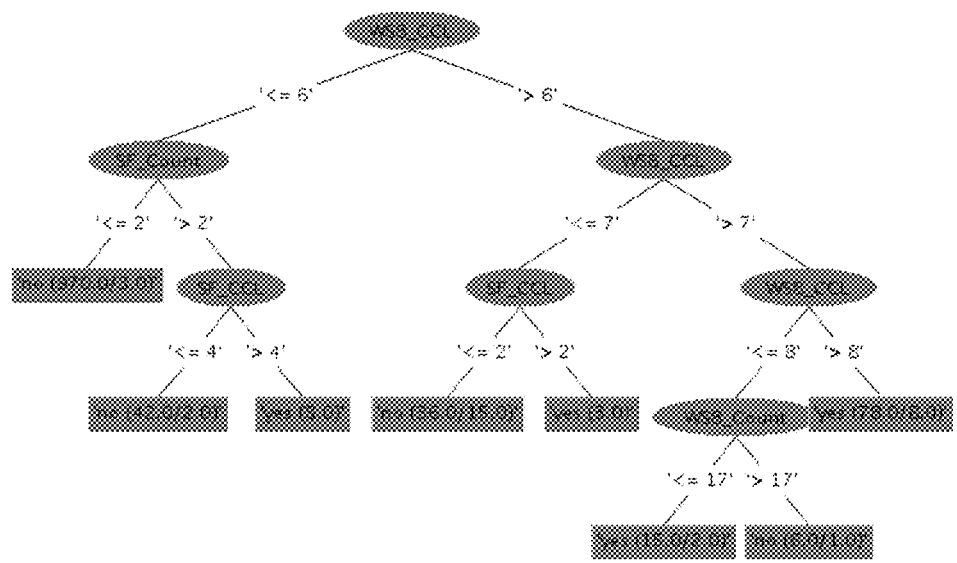
FIG. 17 shows a J48 pruned tree.

FIG. 17 shows the J48 pruned tree. Referring now to FIG. 17, the J48 pruned tree again shows that the size of the connected component provided the primary classification. Interestingly, for the second level of classification attributes we use either single frame active sensors count or again the connected component size.

The size of the connected component of windows of frames is the key attribute in deciding on fall detection. The count of active sensors for single frame has more effect compared to train-test options. The sum of active sensors in a window of frames is of the least importance.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims. It will be understood by those skilled in the art that many changes in construction and circuitry and widely differing embodiments and applications will suggest themselves without departing from the scope of the disclosed subject matter.

What is claimed is:

1. A system that detects personnel, their activity, falls, location, and walking characteristics, the system comprising:
   a smart carpet;
   a data acquisition system that acquires a plurality of signals from the smart carpet, wherein the data acquisition system converts the plurality of signals into serial data in HEX format in a series of frame data and ASCII values suitable for reading as text;
   a computer connected to the data acquisition system that parses the series of frame data and stores the parsed series of frame data in one or more formats for analysis and display, wherein the one or more formats are at least a one of a raw format, a comma separated value format, a matrix format, and a relational database format;
   a fall detection software component configured to run in the computer, the fall detection software component having at least one fall detection algorithm working in conjunction with at least one computational intelligence classifier; and
   a notification software component configured to run in the computer, wherein when the fall detection software component detects a fall, the notification software component sends at least one of a text message, an SMS message, an email, a pager, and a phone call to an authorized party.

2. The system that detects personnel, their activity, falls, location, and walking characteristics according to claim 1 further comprising:
   a gait parameter software algorithm configured to run in the computer, wherein the gait parameter software algorithm determines one or more of a number of steps, a step speed, a step time, a stride time, a step length, and a stride length.

3. The system that detects personnel, their activity, falls, location, and walking characteristics according to claim 1 further comprising:
   a web application and database server configured to run in the computer; and
   at least one second computer having a display, wherein the at least one second computer accesses the web application and views events on the smart carpet in quasi real-time and queries the database server to view past events that occurred on the smart carpet.

4. The system for detecting personnel, their activity, falls, location, and walking characteristics according to claim 1 wherein the smart carpet further comprises:
  at least one segment having a two-dimensional array of n×m sensors; and
  an electrical board connected to the n×m sensors via a cable, the electrical board comprising:
    a signal conditioning circuit that provides impedance matching, amplification, signal detection, and noise subtraction for the plurality of signals received from the two-dimensional array of n×m sensors;
    a sensor number circuit that associates each of the plurality of signals with a one of the n×m sensors that generated each of the plurality of signals;
    a scanning circuit that associates a sensor number for each of the n×m sensors; and
    an analog to digital converter circuit that converts the plurality of signals to digital.

5. The system that detects personnel, their activity, falls, location, and walking characteristics according to claim 4 wherein the smart carpet further comprises:
  a top layer;
  a conductive sensor layer containing the two-dimensional array of n×m sensors, situated below and attached to the top layer;
  a middle substrate layer situated below and attached to the conductive sensor layer;
  a conducting ground layer situated below and attached to the middle substrate layer; and
  a bottom layer situated below and attached to the conducting ground layer.

6. The system that detects personnel, their activity, falls, location, and walking characteristics according to claim 5 wherein the top layer is made of at least a one of a carpet, a vinyl, and a linoleum, and middle substrate layer and the bottom layer are made of a vinyl or an other suitable non-conducting, flexible, or plastic medium.

7. The system that detects personnel, their activity, falls, location, and walking characteristics according to claim 4 wherein the two-dimensional array of n×m sensors further comprise a plurality of rectangular pieces of conducting foil spaced apart and separated from each other on center at a distance that is smaller than a step of an adult person.

8. The system that detects personnel, their activity, falls, location, and walking characteristics according to claim 4 wherein instead of the two-dimensional array of n×m sensors, the at least one segment comprises:
  a plurality of rows of conductor ribbons evenly spaced apart; and
  a plurality of columns of conductor ribbons evenly spaced apart;
  wherein the electrical board is connected to the plurality of rows and the plurality of columns via the cable.

9. The system that detects personnel, their activity, falls, location, and walking characteristics according to claim 8 wherein the smart carpet further comprises:
  a top layer;
  a conductive sensor layer, containing the plurality of rows of conductor ribbons and the plurality of columns of conductor ribbons, situated below and attached to the top layer;
  a middle substrate layer situated below and attached to the conductive sensor layer;
  a conducting ground layer situated below and attached to the middle substrate layer; and
  a bottom layer situated below and attached to the conducting ground layer.

10. The system that detects personnel, their activity, falls, location, and walking characteristics according to claim 1 wherein the at least one fall detection algorithm is at least one of a connected component labeling with different window size of number of frames, a convex hull area with different window size of number of frames, and a heuristic algorithm based on active sensors count and their neighborhood characteristics.

11. The system that detects personnel, their activity, falls, location, and walking characteristics according to claim 10 wherein the at least one computational intelligence classifier is at least one of a Naïve Bayes, a multilayer perceptron, a decision tree J48, and a logistic function.

12. A method for detecting personnel, their activity, falls, location, and walking characteristics, the method comprising the steps of:
  (a) acquiring a plurality of signals from a smart carpet;
  (b) converting the plurality of signals into serial data in HEX format in a series of frame data and ASCII values suitable for reading as text;
  (c) parsing the series of frame data;
  (d) storing the parsed series of frame data in one or more formats for analysis and display;
  (e) running in a computer a fall detection software component having at least one fall detection algorithm working in conjunction with at least one computational intelligence classifier;
  (f) detecting a fall by the fall detection software component; and
  (g) sending at least one of a text message, an SMS message, an email, a pager, and a phone call to an authorized party regarding the detected fall.

13. The method for detecting personnel, their activity, falls, location, and walking characteristics according to claim 12 further comprising the step of:
  processing with a gait parameter software algorithm the plurality of signals received from the two-dimensional array of sensors in the smart carpet to determine one or more of a number of steps, a step speed, a step time, a stride time, a step length, and a stride length.

14. The method for detecting personnel, their activity, falls, location, and walking characteristics according to claim 12 further comprising the step of:
  (h) configuring a web application and database server to run in the computer;
  (i) accessing the web application by at least one second computer having a display;
  (j) displaying on the display in quasi real-time events occurring on the smart carpet; and
  (k) querying a database server to display past events that occurred on the smart carpet.

15. The method for detecting personnel, their activity, falls, location, and walking characteristics according to claim 12 further comprising the step of:
  processing the plurality of signals received from a two-dimensional array of sensors in the smart carpet by performing impedance matching, amplifying, signal detecting, and subtracting noise;
  associating each of the plurality of signals with a one of the sensors that generated each of the plurality of signals;
  associating a sensor number for each of the sensors; and
  converting the plurality of signals from analog to digital.

16. The method for detecting personnel, their activity, falls, location, and walking characteristics according to claim 13 further comprising the step of:

storing a plurality of data generated by the gait parameter software algorithm over time; and analyzing the changes in the plurality of data over time to determine changes in one or more of the step speed, the step time, the stride time, the step length, and the stride length to indicate potential harmful future events.

17. A smart carpet that detects personnel, their activity, falls, location, and walking characteristics, the smart carpet comprising:

at least one segment having a two-dimensional array of n×m sensors, wherein the two-dimensional array of n×m sensors further comprise a plurality of rectangular pieces of conducting foil spaced apart and separated from each other on center at a distance that is smaller than a step of an adult person;

for each of the at least one segments, an electrical board connected to the n×m sensors via a cable, each of the electrical boards for each of the at least one segments fitting within a standard electrical switch box and powered directly from house power, each of the electrical boards further comprising:

a signal conditioning circuit that provides impedance matching, amplification, signal detection, and noise subtraction for the plurality of signals received from the two-dimensional array of n×m sensors;

a sensor number circuit that associates each of the plurality of signals with a one of the n×m sensors that generated each of the plurality of signals;

a scanning circuit that associates a sensor number for each of the n×m sensors; and an analog to digital converter circuit that converts the plurality of signals to digital.

18. The system that detects personnel, their activity, falls, location, and walking characteristics according to claim 17 wherein the top layer is made of at least a one of a carpet, a vinyl, and a linoleum, and middle substrate layer and the bottom layer are made of a vinyl or an other suitable non-conducting, flexible, or plastic medium.

19. The system that detects personnel, their activity, falls, location, and walking characteristics according to claim 17 wherein instead of the two-dimensional array of n×m sensors comprising a plurality of rectangular pieces of conducting foil, the at least one segment comprises:

a plurality of rows of conductor ribbons evenly spaced apart; and a plurality of columns of conductor ribbons evenly spaced apart;

wherein the single electrical board is connected to the plurality of rows and the plurality of columns via the cable.

20. The system that detects personnel, their activity, falls, location, and walking characteristics according to claim 17 wherein the smart carpet further comprises:

a top layer;

a conductive sensor layer, containing the plurality of rows of conductor ribbons and the plurality of columns of conductor ribbons, situated below and attached to the top layer;

a middle substrate layer situated below and attached to the conductive sensor layer;

a conducting ground layer situated below and attached to the middle substrate layer; and a bottom layer situated below and attached to the conducting ground layer.

* * * * *